(12) United States Patent
Nishii

(10) Patent No.: US 8,477,283 B2
(45) Date of Patent: Jul. 2, 2013

(54) EXPOSURE APPARATUS AND DEVICE MANUFACTURING METHOD

(75) Inventor: Yasufumi Nishii, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1061 days.

(21) Appl. No.: 11/798,127

(22) Filed: May 10, 2007

(65) Prior Publication Data

US 2007/0296939 A1    Dec. 27, 2007

Related U.S. Application Data

(60) Provisional application No. 60/801,380, filed on May 19, 2006.

(30) Foreign Application Priority Data

May 10, 2006    (JP) .................................. 2006-131280

(51) Int. Cl.
G03B 27/42        (2006.01)
G03B 27/52        (2006.01)

(52) U.S. Cl.
USPC .............................................. 355/30; 355/53

(58) Field of Classification Search
USPC ..................... 355/30, 35, 72, 77, 53; 430/311
See application file for complete search history.

(56) References Cited

U.S. PATENT DOCUMENTS

| | | |
|---|---|---|
| 4,346,164 A | 8/1982 | Tabarelli et al. |
| 4,480,910 A | 11/1984 | Takanashi et al. |
| 5,610,683 A | 3/1997 | Takahashi |
| 5,715,039 A | 2/1998 | Fukuda et al. |
| 5,825,043 A | 10/1998 | Suwa |
| 6,608,681 B2 | 8/2003 | Tanaka et al. |
| 6,778,257 B2 | 8/2004 | Bleeker et al. |
| 6,897,963 B1 | 5/2005 | Taniguchi et al. |
| 2004/0165159 A1 | 8/2004 | Lof et al. |
| 2004/0263809 A1 | 12/2004 | Nakano |
| 2005/0007569 A1* | 1/2005 | Streefkerk et al. ............... 355/30 |
| 2005/0219483 A1* | 10/2005 | Baselmans et al. ............. 355/30 |
| 2005/0259234 A1* | 11/2005 | Hirukawa et al. ............... 355/53 |
| 2005/0280791 A1* | 12/2005 | Nagasaka et al. ............... 355/53 |
| 2006/0028632 A1 | 2/2006 | Hazelton et al. |
| 2006/0250593 A1 | 11/2006 | Nishii |

(Continued)

FOREIGN PATENT DOCUMENTS

| | | |
|---|---|---|
| CN | 1723542 | 1/2006 |
| DE | 221 563 A1 | 9/1983 |

(Continued)

OTHER PUBLICATIONS

Feb. 3, 2010 Office Action (Notice of Allowance) issued in Singapore Patent Application No. 200808295-0.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

An exposure apparatus comprises a first member, which is arranged so as to oppose a surface of a substrate, and between which and the surface of the substrate a liquid immersion space is formed; and a second member, which traps liquid that is present at the surface of the substrate. A distance between the second member and the substrate is smaller than a distance between the first member and the substrate.

42 Claims, 21 Drawing Sheets

U.S. PATENT DOCUMENTS

| | | | |
|---|---|---|---|
| 2007/0139628 A1* | 6/2007 | Nagasaka et al. | 355/30 |
| 2007/0216889 A1* | 9/2007 | Nishii | 355/67 |
| 2008/0018866 A1 | 1/2008 | Nagasaka et al. | |
| 2008/0233512 A1 | 9/2008 | Nishii et al. | |
| 2008/0284991 A1 | 11/2008 | Nishii | |
| 2009/0122282 A1 | 5/2009 | Nishii | |
| 2009/0122283 A1 | 5/2009 | Hasegawa | |
| 2009/0280436 A1 | 11/2009 | Nishii | |

FOREIGN PATENT DOCUMENTS

| | | |
|---|---|---|
| DE | 224 448 A1 | 7/1985 |
| EP | 1 571 697 | 9/2005 |
| EP | 1 628 163 A2 | 2/2006 |
| EP | 1 768 169 A1 | 3/2007 |
| EP | 1 768 170 A1 | 3/2007 |
| JP | A 58-202448 | 11/1983 |
| JP | A 59-019912 | 2/1984 |
| JP | A 62-065326 | 3/1987 |
| JP | A 63-157419 | 6/1988 |
| JP | A 04-305915 | 10/1992 |
| JP | A 04-305917 | 10/1992 |
| JP | A 05-062877 | 3/1993 |
| JP | A 06-124873 | 5/1994 |
| JP | A 07-220990 | 8/1995 |
| JP | A 08-313842 | 11/1996 |
| JP | A 08-316125 | 11/1996 |
| JP | A 10-92722 | 4/1998 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-135400 | 5/1999 |
| JP | A 11-176727 | 7/1999 |
| JP | A 11-260706 | 9/1999 |
| JP | A 2000-058436 | 2/2000 |
| JP | A 2000-505958 | 5/2000 |
| JP | A 2000-164504 | 6/2000 |
| JP | A 2001-510577 | 7/2001 |
| JP | A 2001-338868 | 12/2001 |
| JP | A 2004-304135 | 10/2004 |
| JP | A 2005-019864 | 1/2005 |
| JP | A 2005-353820 | 12/2005 |
| JP | A-2007-142366 | 6/2007 |
| WO | WO 99/23692 | 5/1999 |
| WO | WO 99/28790 | 6/1999 |
| WO | WO 99/49504 | 9/1999 |
| WO | WO 01/35168 A1 | 5/2001 |
| WO | WO 2005/119742 | 12/2002 |
| WO | WO 2004/019128 A2 | 3/2004 |
| WO | WO 2004/086468 A1 | 7/2004 |
| WO | WO 2005/024517 A2 | 3/2005 |
| WO | WO 2005/059617 A2 | 6/2005 |
| WO | WO 2005/059618 A2 | 6/2005 |
| WO | WO 2005/122221 A1 | 12/2005 |
| WO | WO 2007/046523 A1 | 4/2007 |

OTHER PUBLICATIONS

Dec. 4, 2009 Office Action issued in Chinese Patent Application No. 2007800163581. (with translation).

Aug. 14, 2007 International Search Report issued in PCT/JP2007/059674. (with translation).

Aug. 14, 2007 Written Opinion of the International Search Authority issed in PCT/JP2007/059674. (with translation).

Apr. 30, 2010 Office Action for Chinese Patent Application No. 200780016358.1 (with translation).

Nov. 30, 2011 European Search Report in corresponding Appln. No. 07743109.6.

Japanese Patent Office, Notice of Reasons for Rejection mailed Mar. 6, 2012 in Japanese Patent Application No. 2008-514527 w/English-language Translation.

Jul. 17, 2012 Office Action issued in Japanese Patent Application No. 2008-514527 (with translation).

* cited by examiner

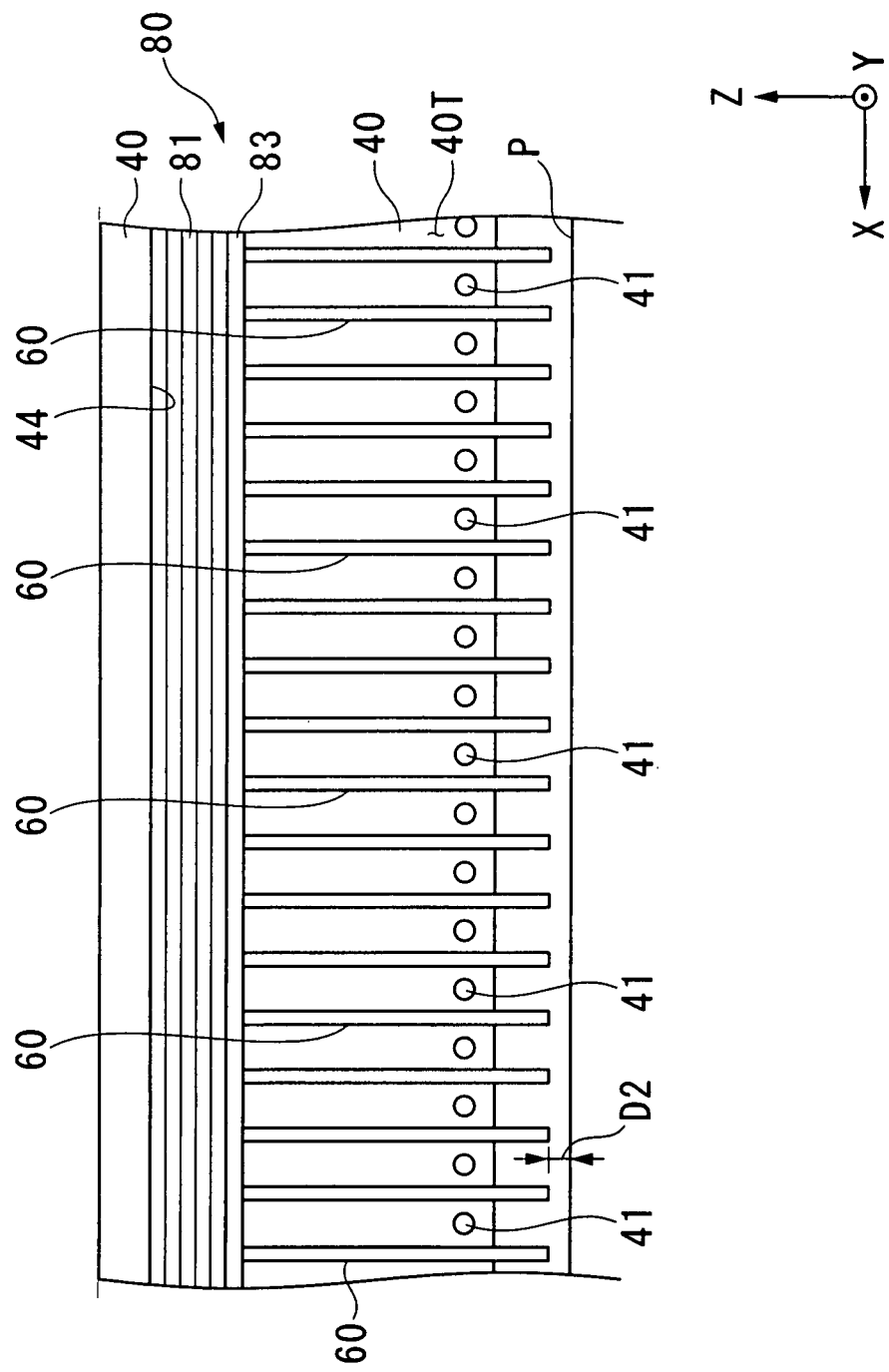

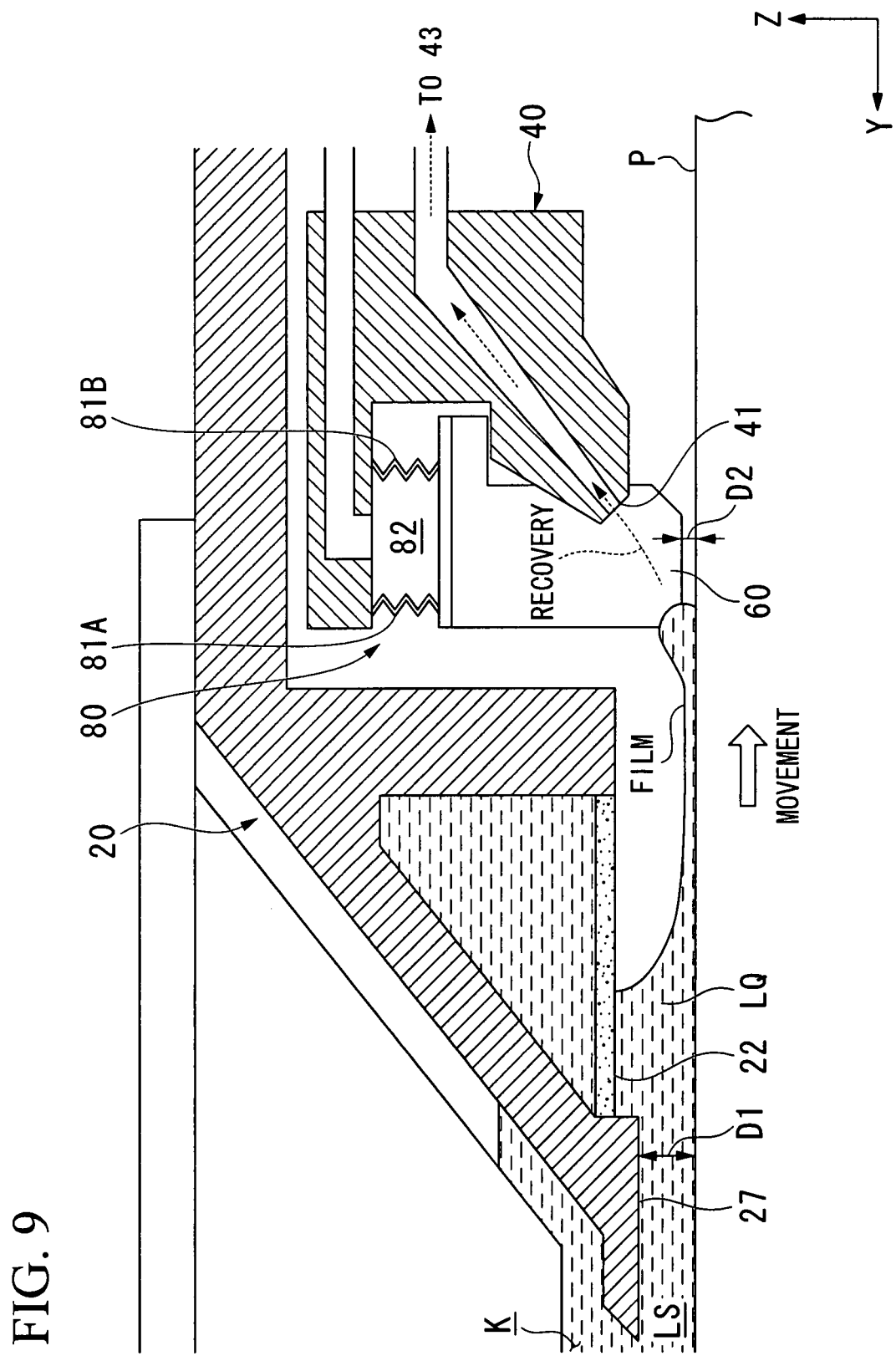

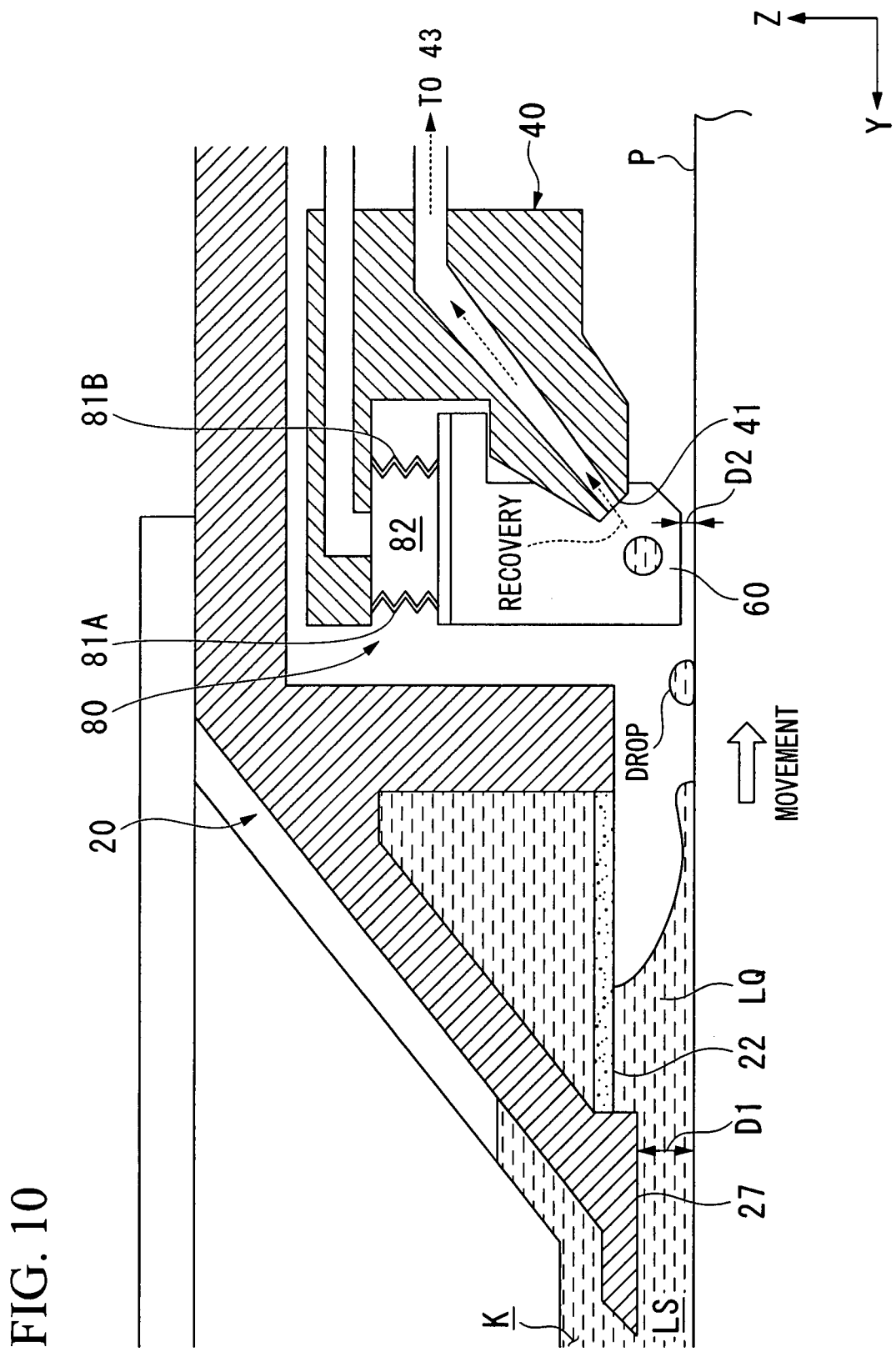

EXPOSURE APPARATUS AND DEVICE MANUFACTURING METHOD

CROSS-REFERENCE TO RELATED APPLICATION

This application is a non-provisional application claiming benefit of provisional application No. 60/801,380, filed May 19, 2006, and claims priority to Japanese Patent Application No. 2006-131280, filed May 10, 2006, the contents of which are incorporated herein by reference.

BACKGROUND OF THE INVENTION

1. Field of the Invention

The present invention relates to an exposure apparatus, which exposes a substrate, and a device manufacturing method.

2. Description of Related Art

Among exposure apparatuses used in photolithography processes, liquid immersion exposure apparatuses that expose a substrate via a liquid, such as that disclosed in PCT International Publication No. WO 99/49504.

In any case, in exposing apparatuses, with the objective of improved device productivity, etc., higher substrate movement velocities, for example, have been in demand. In the case where the substrate movement velocity has been increased, there is a possibility that liquid will leak out from a prescribed space on the substrate. When the liquid that has leaked from the prescribed space remains on the substrate, there is concern that this will lead to substrate exposure defects and to pattern defects being formed on the substrate.

A purpose of the invention is to provide an exposure apparatus that is able to restrict liquid from remaining on the substrate and a device manufacturing method that uses that exposure apparatus.

SUMMARY OF THE INVENTION

According to a first aspect of the invention, an exposure apparatus that irradiates exposure light onto a substrate to expose the substrate is provided, the apparatus comprising: a first member, which is arranged so as to oppose a surface of the substrate, and between which and a surface of the substrate a liquid immersion space is formed; and a second member, which traps liquid that is present at the surface of the substrate, a distance between the second member and the substrate being smaller than a distance between the first member and the substrate.

Through the first aspect of the invention, it is possible to restrict the liquid from leaking out.

According to a second aspect of the invention, an exposure apparatus that irradiates exposure light onto a substrate to expose the substrate is provided, the apparatus comprising a first member, which has a first liquid recovery port arranged so as to oppose a surface of the substrate, and between which and the surface of the substrate a liquid immersion space is formed; a second liquid recovery port that recovers liquid being present at the surface of the substrate, a distance between the second liquid recovery port and the surface of the substrate being smaller than a distance between the first member and the substrate; and a gas blow out port, which is arranged at the outer side of the second liquid recovery port with respect to an optical path space of the exposure light and blows out gas toward the surface of the substrate.

Through the second aspect of the invention, it is possible to restrict the liquid from leaking out.

According to a third aspect of the invention, a device manufacturing method that uses an exposure apparatus is provided.

Through the third aspect of the invention, it is possible to manufacture devices using an exposure apparatus in which leaking out of liquid has been restricted.

BRIEF DESCRIPTION OF THE DRAWINGS

FIG. 7 is a view of the vicinity of a trap member relating to the first embodiment as seen from the +Y side.

FIG. 9 is a schematic view that shows a status in which a trap member is trapping the liquid.

FIG. 10 is a schematic view that shows a status in which a trap member is trapping the liquid.

DETAILED DESCRIPTION OF THE INVENTION

Below, an embodiment of the present invention will be explained while referring to drawings, but the present invention is not limited to these. Note that, in the explanation below, an XYZ orthogonal coordinate system be set up, and the positional relationships among the respective members will be explained while referring to this XYZ orthogonal coordinate system. In addition, a prescribed direction within the horizontal plane is the X axis direction, a direction perpendicular to the X axis direction within the horizontal plane is the Y axis direction, and a direction (that is, the vertical direction) respectively perpendicular to the X axis direction and the Y axis direction is the Z direction. In addition, the directions of rotation (tilting) about the X axis, the Y axis and the Z axis are the θX, θY and θZ directions respectively.

First Embodiment

Figure 1:
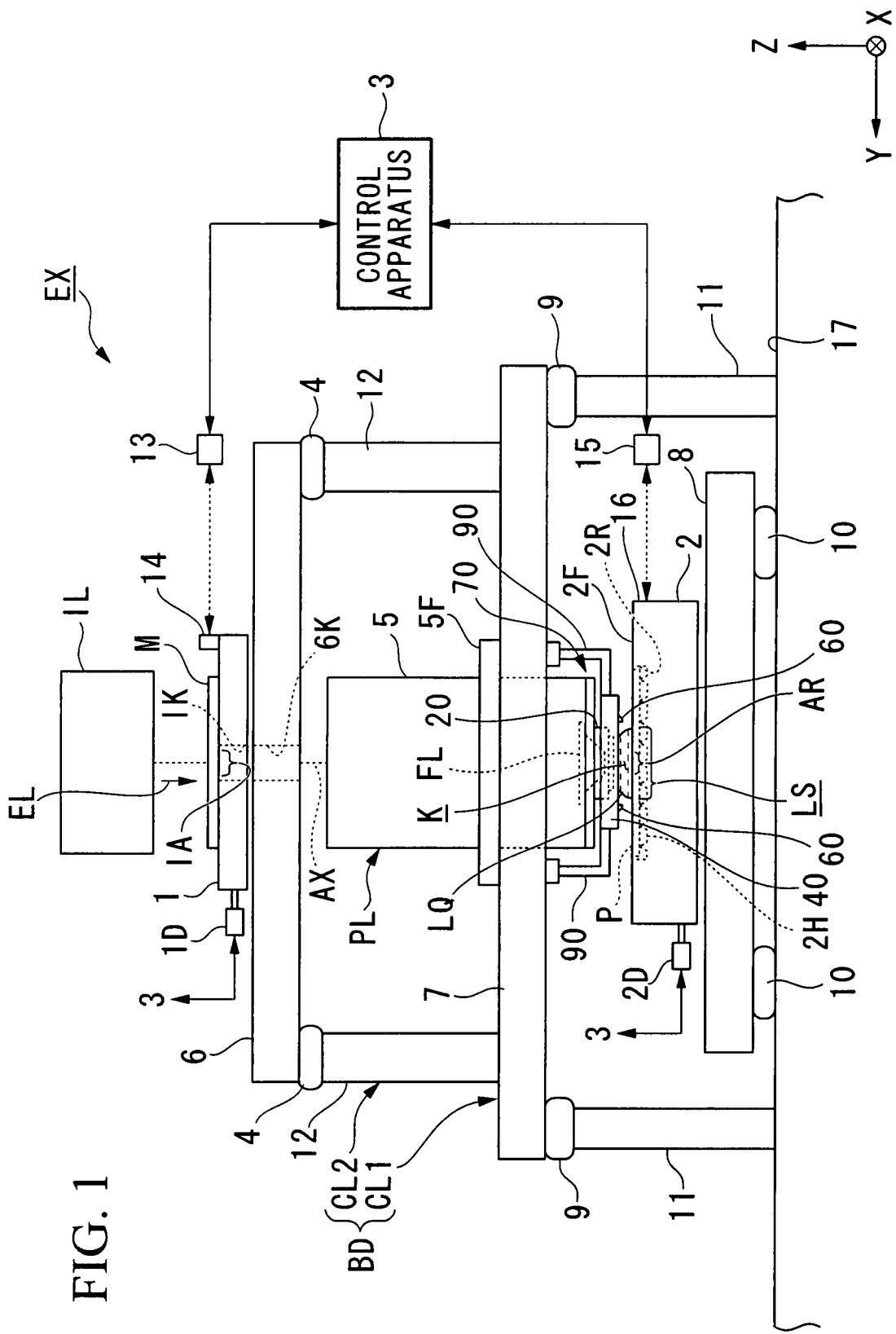
FIG. 1 is a schematic block diagram that shows an exposure apparatus relating to the first embodiment.

A first embodiment will be explained. FIG. 1 is a schematic block diagram that shows a exposure apparatus EX relating to the first embodiment. In FIG. 1, the exposure apparatus EX comprises a mask stage 1 that holds a mask and is able to move, a substrate 2 that holds a substrate P and is able to move, an illumination system IL that uses exposure light EL to illuminate the pattern of the mask M, a projection optical system PL that projects the pattern image of the mask M illuminated by the exposure light EL onto the substrate P, and a control apparatus 3 that controls operation of the entire exposure apparatus EX. Note that, here, "substrate" includes those in which a photosensitive material (photoresist) has been coated onto a base material such as a semiconductor wafer including silicone wafer, for instance, and those that are coated with various kinds of film such as protective film (top coat film) different from photosensitive film. "Mask" includes reticles in which a device pattern that has been reduction projected onto a substrate has been formed. The mask includes a transparent plate member such as a glass plate and a prescribed pattern formed on the transparent plate member using light shielding film such as chrome. This transparent mask is not limited to a binary mask on which pattern is formed with photo shielding film; for example, a half-tone type mask or a phase shift mask of the spatial frequency modulation type is also included. In addition, in the present embodiment, a transparent type mask is used as the mask, but a reflecting type mask may also be used.

The exposure apparatus EX of the present embodiment is a liquid immersion exposure apparatus that applies the liquid immersion method to effectively shorten the exposure wavelength to improve resolution while effectively widening the depth of focus. The exposure apparatus EX comprises a nozzle member 20, which is arranged so as to oppose the surface of the substrate P and forms a liquid immersion (a liquid immersion space LS) between itself and the surface of the substrate P. The liquid immersion space LS is a space that has been filled with a liquid LQ. The nozzle member 20 has a liquid supply port 21 (not shown in FIG. 1), which supplies the liquid LQ for forming the liquid immersion space LS, and a first liquid recovery port 22 (not shown in FIG. 1), which recovers the liquid LQ. The nozzle member 20 forms a liquid immersion space LS between itself and the surface of the substrate P so that the optical path space K of the exposure light EL of the image plane side (light emergence side) of the projection optical system PL, specifically, the optical path space K of the exposure light EL between the projection optical system PL and the substrate P, is filled with the liquid LQ. In FIG. 1, a liquid immersion space LS is formed between the substrate P and the projection optical system PL that opposes it and the nozzle member 20. The optical path space K of the exposure light EL is a space that includes the optical path in which the exposure light EL progresses. In the present embodiment, water (pure water) is used as the liquid LQ.

The exposure apparatus EX forms a liquid immersion space LS between the nozzle member 20 and the surface of the substrate P at least while the pattern image of the mask M is being projected onto the substrate P. The exposure apparatus EX forms a liquid immersion space LS so that the optical path space K of the exposure light EL is filled with the liquid LQ, and irradiates the exposure light EL that has passed through the mask M onto the substrate P, which is held by the substrate stage 2, via that liquid LQ. Then, the pattern image of the mask M is projected onto the substrate P, and the substrate P is exposed.

In addition, in the present embodiment, a liquid immersion area is formed at a portion on the substrate P that includes the projection area AR of the projection optical system PL during exposure of the substrate P. Specifically, a local liquid immersion system, in which a partial area on the substrate P that includes the projection area AR of the projection optical system PL is covered by the liquid LQ of the liquid immersion space LS, is employed.

Note that, in the present embodiment, an explanation is given mainly for the case in which a liquid immersion space LS is formed in a status in which the nozzle member 20 opposes the surface of the substrate P. The nozzle member 20, at the image plane side of the projection optical system PL, is able to form a liquid immersion space LS between itself and the surface of an object arranged at a position at which the exposure light EL can be irradiated, specifically, also between itself and the surface of an object arranged at a position that opposes the light emergence plane of the projection optical system PL. For example, the nozzle member 20 is also able to form a liquid immersion space LS between itself and the upper surface of the substrate stage 2 arranged at a position that opposes the light emergence plane of the projection optical system PL.

In the present invention, as will be discussed below, the exposure apparatus EX comprises trap members 60, which trap the liquid LQ that is present at the surface of the substrate P. The trap members 60 are provided at the outer side of the nozzle member 20 with respect to the optical path space K of the exposure light EL. A liquid recovery member 40, which has second liquid recovery ports 41 (not shown in FIG. 1) that are separate from the first liquid recovery port 22 (not shown in FIG. 1) of the nozzle member 20, is arranged at the outer side of the nozzle member 20 with respect to the optical path space K of the exposure light EL. In the present embodiment, the trap member 60 are supported by the liquid recovery member 40. In the present embodiment, in a status in which at least the liquid immersion space LS is formed, the distance D2 between to trap members 60 and the substrate P is smaller than the distance D1 between the nozzle member 20 and the substrate P.

In the present embodiment, the exposure apparatus EX is a scanning type exposure apparatus (so-called scanning stepper) that projects the pattern image of the mask M onto to the substrate P while synchronously moving the mask M and the substrate P in a prescribed scanning direction. In the present embodiment, the scanning direction (synchronous movement direction) of the substrate P is the Y axis direction, and the scanning direction (synchronous movement direction) of the mask M is also the Y axis direction. In the exposure apparatus EX, the shot area on the substrate P moves in the Y axis direction with respect to the projection area AR of the projection optical system PL, and the pattern formation area of the mask M moves in the Y axis direction with respect to the illumination area IA of the illumination system IL in synchronization with that movement of the substrate P in the Y axis direction. The projection area AR is irradiated with exposure light EL via the projection optical system PL and the liquid LQ, and a shot area on the substrate P is exposed with a pattern image formed in the projection area AR.

The exposure apparatus EX comprises a body BD that includes a first column CL1, which is provided on a floor surface 17 within a clean room, for example, and a second column CL2, which is provided on the first column CL1. The first column CL1 comprises a plurality of first struts 11 and a lens barrel base plate 7, which is supported by those first struts 11 via vibration proofing apparatuses 9. The second column CL2 comprises a plurality of the second struts 12, which are provided on the lens barrel base plate 7, and a first base plate 6 supported by those second struts 12 via vibration proofing apparatuses 4. The respective vibration proofing apparatuses 4 and vibration proofing apparatuses 9 include active vibration proofing apparatuses comprising prescribed actuators and damper mechanisms.

The illumination system IL illuminates a prescribed illumination area IA on the mask M using exposure light EL with a uniform illumination intensity. Used as the exposure light EL that emerges from the illumination system IL is, for example, deep ultraviolet light (DUV light) such as ultraviolet band bright lines (g-rays, h-rays, i-rays) that emerge from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm). In the present embodiment, ArF excimer laser light is used.

The mask stage 1 can be moved in the X axis, Y axis and θZ directions on the first base plate 6, in a status in which the mask M is held, by the driving of a mask stage drive apparatus 1D that includes an actuator such as a linear motor. The mask state 1 is supported without contact with respect to the upper surface (guide surface) of the first base table 6 by means of an air bearing (air pad). The mask stage 1 has a first opening 1K for allowing the exposure light EL to pass through during exposure of the substrate P. The first base plate 6 has a second opening 6K for allowing the exposure light EL to pass through. The exposure light EL that has emerged from the illumination system IL and has illuminated the pattern formation area of the mask M is incident to projection optical system PL after it has passed through the first opening 1K of the mask stage 1 and the second opening 6K of the first base plate 6.

Position information of the mask stage 1 (and, in turn, the mask M) is measured by a laser interferometer 13. The laser interferometer 13 measures position information of the mask stage 1 using a measuring mirror 14 provided on the mask stage 1. The control apparatus 3 drives the mask stage drive apparatus 1D based on the measurement results of the laser interferometer 13 to perform positional control of the mask M held by the mask stage 1.

The projection optical system PL projects the pattern image of the mask M to the substrate P at a prescribed projection magnification ratio, and it has a plurality of optical elements, and those optical elements are held by a lens barrel 5. The lens barrel 5 has a flange 5F. And the projection optical system PL is supported by the lens barrel base plate 7 via the flange 5F. In addition, it is possible to provide vibration proofing apparatus between the lens barrel base plate 7 and the lens barrel 5. The projection optical system PL of the present embodiment is a reduction system in which the projection magnification ratio is, for example, 1/4, 1/5 or 1/8 and so on, and reduction image of the pattern is formed on the exposure area on the substrate. Note that the projection optical system PL may be a reduction system, a magnification system or an enlargement system. In addition, the projection optical system PL may also be any of a dioptric system that does not include a reflecting optical element, a catoptric system that does not include a refracting optical element, or a catadioptric system that includes both a reflecting optical element and a refracting optical element. In addition, the projection optical system PL may form either an inverted image or an erect image.

The substrate stage 2 has a substrate holder 2H, which holds the substrate P. The substrate stage 2 is able to move in directions with six degrees of freedom, which are the X axis, Y axis, Z axis, θX, θY and θZ directions, on the second base plate 8 in a status in which substrate P is held by the substrate holder 2H by means of the driving of the substrate stage drive apparatus 2D, which includes an actuator such as a linear motor. The substrate holder 2H of the substrate stage 2 holds the substrate P so that the surface of the substrate P and the XY plane are nearly parallel. The substrate stage 2 is supported without contact with respect to the upper surface (guide surface) of the second base plate 8 by means of an air bearing. The second base plate 8 is supported on the floor surface 17 via vibration proofing apparatuses 10. The vibration proofing apparatuses 10 include active vibration proofing apparatuses that comprise prescribed actuators and damper mechanisms. Position information of the substrate stage 2 (and, in turn, the substrate P) is measured by a laser interferometer 15. The laser interferometer 15 measures position information of the substrate stage 2 into the X axis, Y axis and θZ directions using a measuring mirror 16 provided on the substrate stage 2. In addition, the exposure apparatus EX comprises a focus leveling detection system that is not shown in the drawing which is able to detect surface position information (position information relating to the Z axis, θX and θY directions) of the surface of the substrate P held by the substrate stage 2. The control apparatus 3 drives the substrate stage drive apparatus 2D and performs positional control of the substrate P held by the substrate stage 2 based on the measuring results of the laser interferometer 15 and the detection results of the focus leveling detection system.

The focus leveling detection system can detect the surface position data of the substrate P by measuring the position data of each of the plurality of measurement points in the Z-axis direction of the substrate P, as disclosed in the U.S. Pat. No. 6,608,681, for example. The laser interferometer 15 may be used to measure the position data of the substrate stage 2 in the Z-axis, θX and θY directions. This is disclosed in detail for example in Published Japanese Translation No. 2001-510577 of PCT International Publication (corresponding PCT International Publication No. WO 1999/28790).

In addition, in the present embodiment, a recess part 2R is provided on the substrate stage 2, and the substrate holder 2H is arranged in that recess part 2R. In addition, the upper surface 2F of the substrate stage 2 other than the recess part 2R is a flat surface such that it comes to nearly the same height (flush) as the surface of the substrate P held by the substrate holder 2H.

Figure 2:
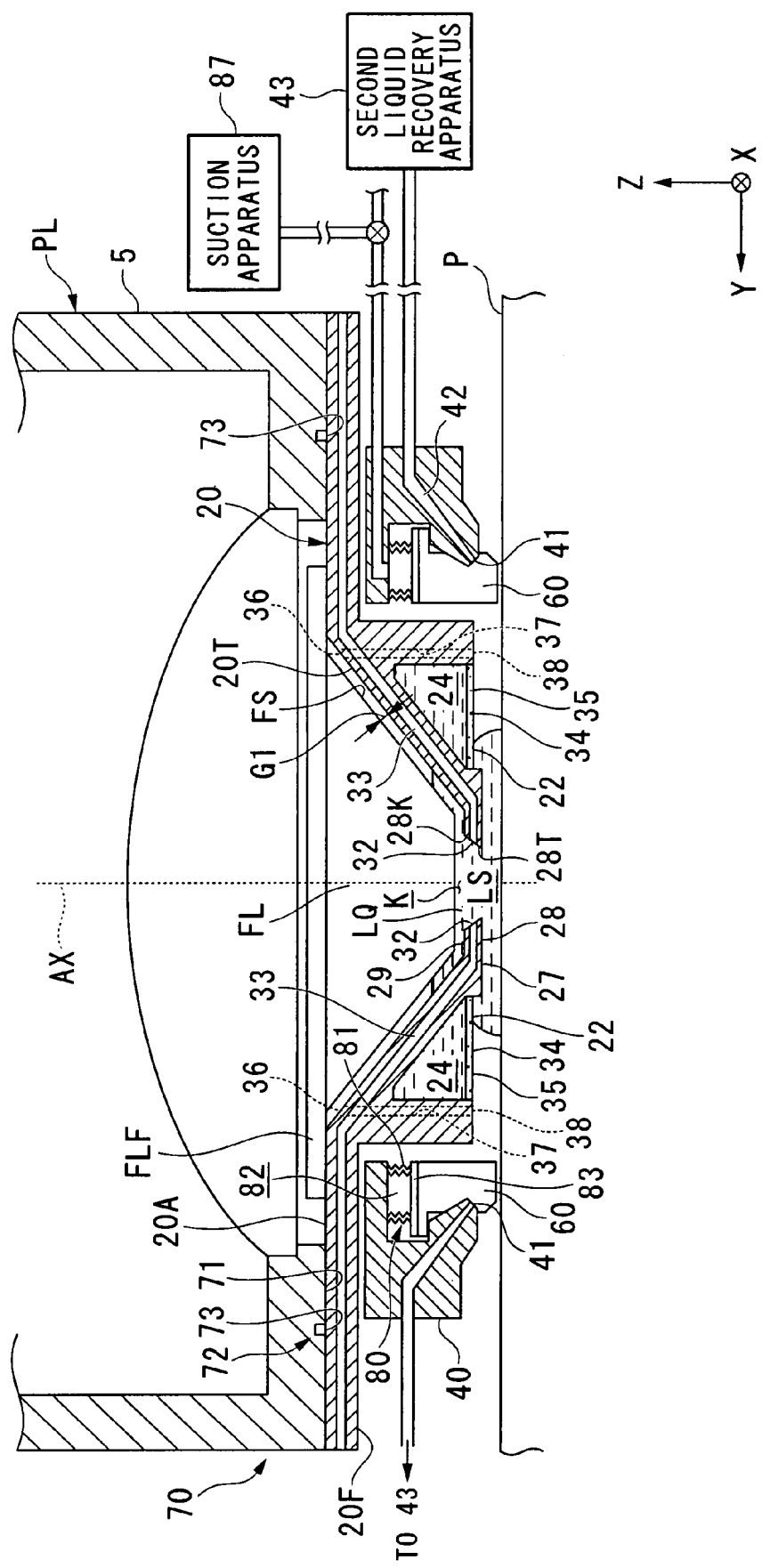
FIG. 2 is a side cross sectional view that is parallel to the YZ plane and shows the vicinity of the nozzle member relating to the first embodiment.
Figure 4:
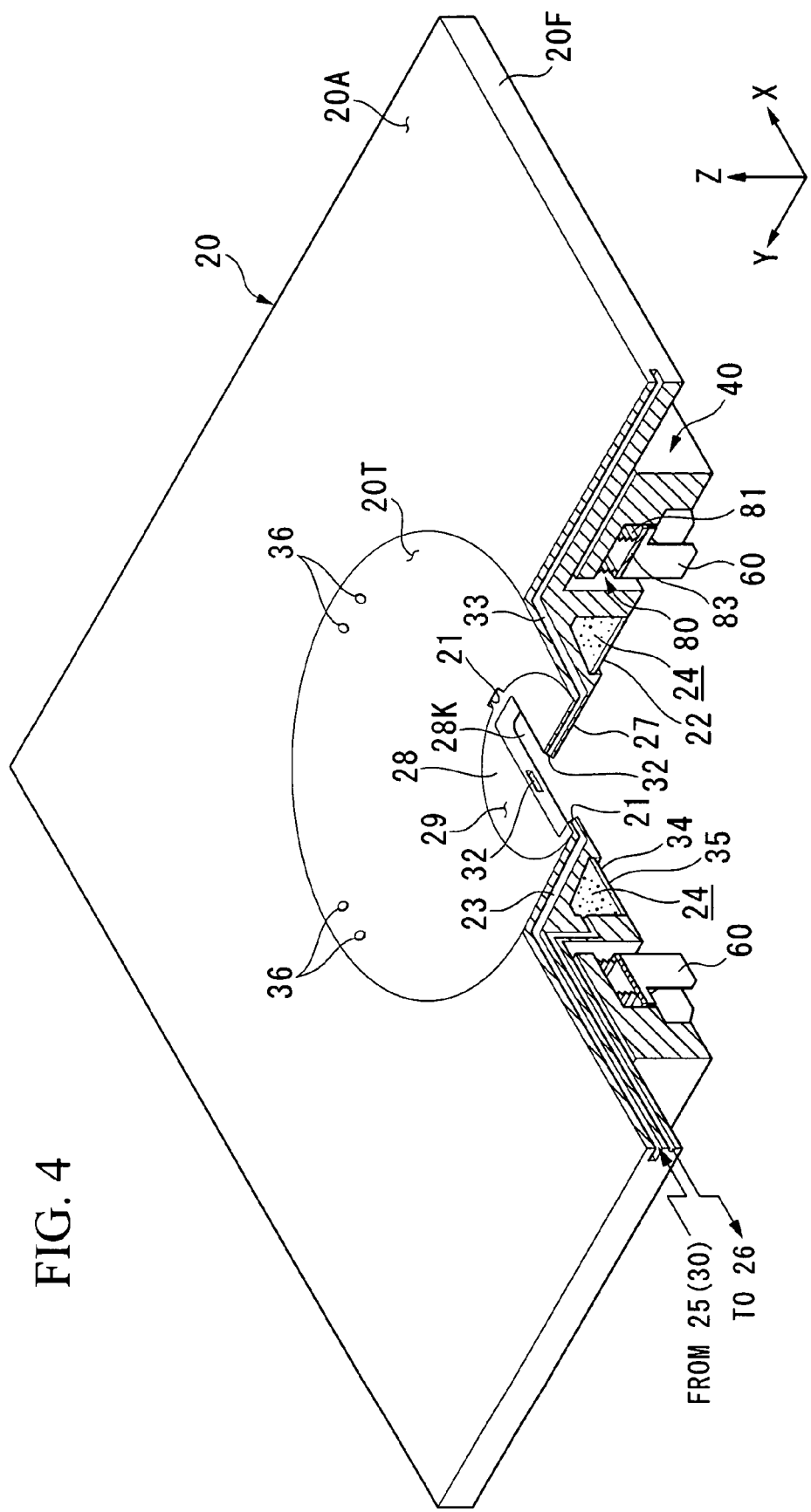
FIG. 4 is a partial cutaway view of a schematic perspective view that shows the vicinity of the nozzle member relating to the first embodiment.
Figure 5:
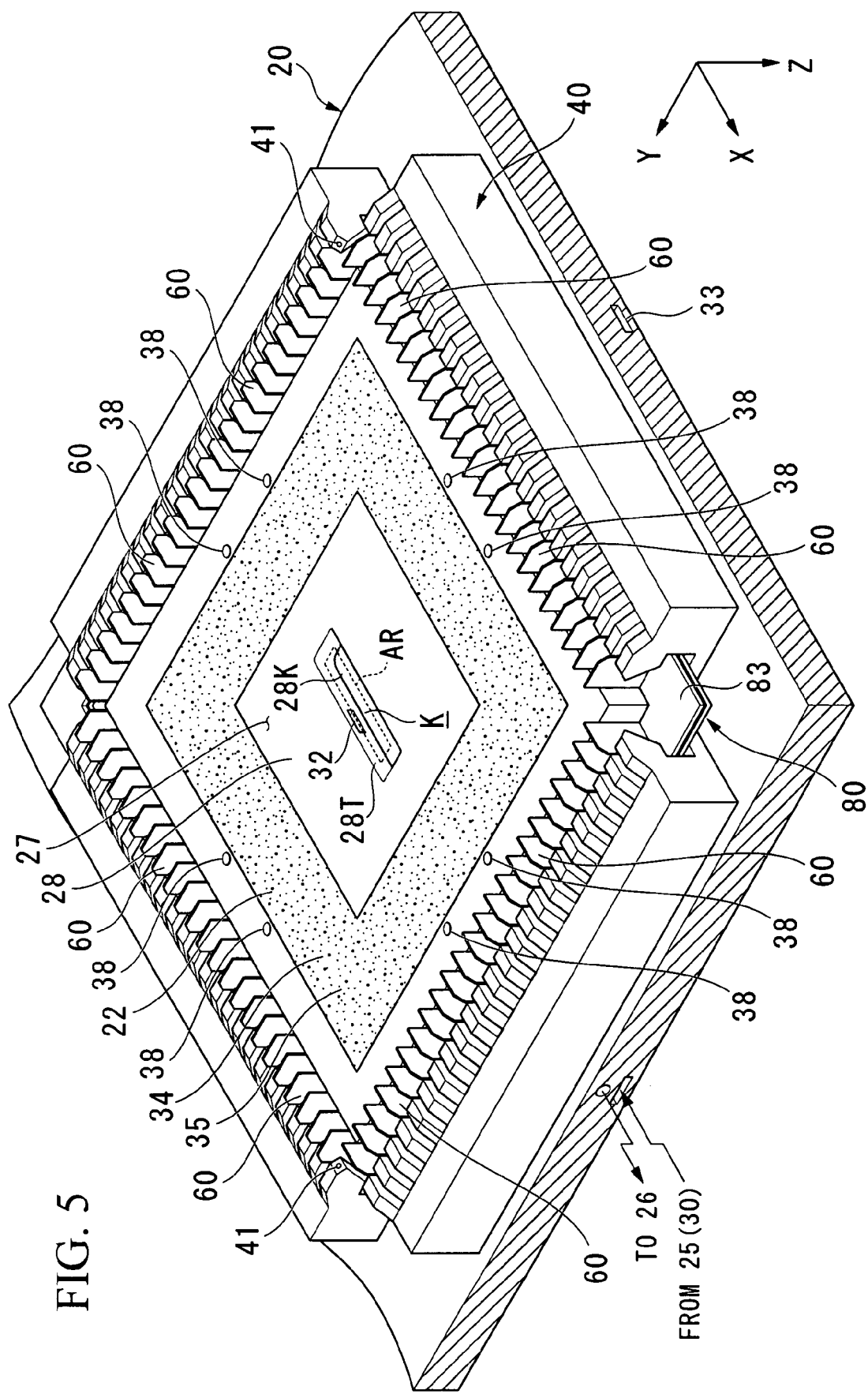
FIG. 5 is a perspective view of the vicinity of the nozzle member relating to the first embodiment as seen from the lower side.

Next, the nozzle member 20, the trap members 60, and the liquid recovery member 40 will be explained while referring to FIG. 1 to FIG. 5. FIG. 2 is a side cross sectional view that is parallel with the YZ plane and shows the vicinity of the nozzle member 20, the trap members 60 and the liquid recovery member 40, FIG. 3 is a side cross sectional view that is parallel with the XZ plane, FIG. 4 is a partial cutaway view of a schematic oblique view, and FIG. 5 is an oblique view as seen from the lower side.

The exposure apparatus EX comprises a nozzle member 20, which is arranged so as to oppose the surface of the substrate P and forms a liquid immersion space LS between itself and the surface of the substrate P, trap members 60, which trap the drop-shaped and/or thin film-shaped liquid LQ that is present at the surface of the substrate P, and a liquid recovery member 40 arranged at the outer side of the nozzle member 20 with respect to the optical path space K of the exposure light EL.

The nozzle member 20 forms a liquid immersion space LS so that the optical path space K of the exposure light EL between the projection optical system PL and the substrate P is filled with the liquid LQ. Specifically, the nozzle member 20 forms a liquid immersion space LS so that the optical path space K of the exposure light EL between the light emergence surface (lower surface) of the final optical element FL, which is nearest the image plane of the projection optical system PL from among the plurality of optical elements of the projection optical system PL, and the surface of the substrate P on the substrate stage 2 arranged on the image plane side of the projection optical system PL is filled with the liquid LQ.

Figure 3:
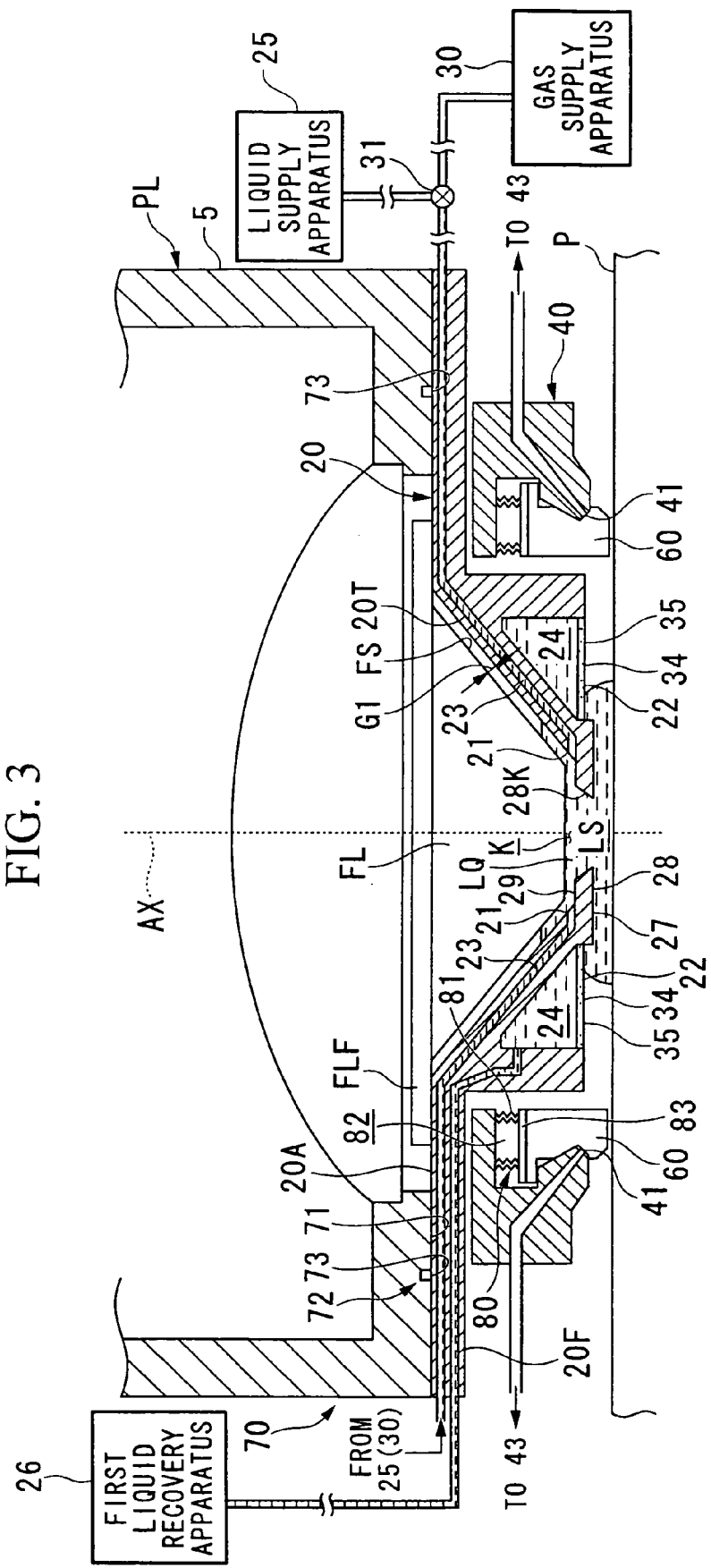
FIG. 3 is a side cross sectional view that is parallel to the XY plane and shows the vicinity of the nozzle member relating to the first embodiment.

As shown in FIG. 1, FIG. 2, and FIG. 3, the exposure apparatus EX comprises a holding mechanism 70, which holds the nozzle member 20. In the present embodiment, at least a portion of the holding mechanism 70 is provided on the lens barrel 5. The nozzle member 20 is held by the holding mechanism 70 provided on that lens barrel 5. In addition, the exposure apparatus EX comprises a first support mechanism 80, which supports the trap members 60, and a second support mechanism 90, which supports the liquid recovery member 40. In the present embodiment, the first support mechanism 80 is connected to the liquid recovery member 40. The trap members 60 are supported by the liquid recovery member 40 via the first support mechanism 80. In addition, in the present embodiment, the second support mechanism 90 is connected to the lens barrel base plate 7 of the first column CL1. The liquid recovery member 40 is supported by the lens barrel base plate 7 of the first column CL1 via the second support mechanism 90.

The holding mechanism 70 has a holding surface 71, which is formed at the lower end of the lens barrel 5 and comes into contact with at least a portion of the upper surface 20A of the nozzle member 20. The holding surface 71 is provided so as to surround the final optical element FL. The nozzle member 20 of the present embodiment comprises a flange 20F. The flange 20F is provided at the upper part of the nozzle member 20. When the nozzle member 20 is held by the holding mechanism 70, prescribed areas of the holding surface 71 of the holding mechanism 70 and the upper surface 20A of the flange 20F of the nozzle member 20 come into contact.

The holding mechanism 70 has a chuck mechanism 72 that chucks the nozzle member 20. The chuck mechanism 72 comprises suction port 73, which are respectively provided at a plurality of prescribed positions of the holding surface 71, and a suction apparatus that is not shown in the drawing and that is connected to those suction ports 73 via flow paths. At least a portion of the flow paths that connect the suction ports 73 and the suction apparatus are formed at the interior of the lens barrel 5. The suction apparatus includes a vacuum system as a vacuum pump. The control apparatus 3 is able to chuck the nozzle member 20 to the holding surface 71 by driving the suction apparatus of the chuck mechanism 72 to suction the gas from the suction ports 73. In addition, the control apparatus 3 separates the nozzle member 20 from the holding surface 71 by controlling the chuck mechanism 72 that includes the suction apparatus to cancel suction of the nozzle member 20 by the chuck mechanism 72. In this way, in the present embodiment, the holding mechanism 70, which includes the chuck mechanism 72, holds the nozzle member 20 so that it can be attached and removed. Note that the holding mechanism 70 may be equipped with an electrostatic chuck mechanism that uses the force of static electricity. With an electrostatic chuck mechanism as well, the holding mechanism 70 is able to hold the nozzle member 20 so that it can be attached and removed. In addition, the nozzle member 20 may be secured to the lens barrel 5 or a separate member (for example, the lens barrel base plate 7).

The nozzle member 20 that has been chucked to the holding surface 71 is arranged so as to oppose the surface of the substrate P (and/or the upper surface 2F of the substrate stage 2) in the vicinity of the final optical element FL that emits the exposure light EL. The nozzle member 20 is an annular member, and it is arranged above the substrate P (and/or the substrate stage 2) so as to surround the final optical element FL. In the present embodiment, the final optical element FL is supported by the nozzle member 20. In the present embodiment, the final optical element FL comprises a flange FLF. The nozzle member 20 holds the flange FLF of the final optical element FL. The flange FLF is formed at the upper portion of the final optical element FL. The nozzle member 20 holds the lower surface of the flange FLF of the final optical element FL in a prescribed area of the upper surface 20A. Note that it may also be such that the final optical element FL is supported by the lens barrel 5.

The final optical element FL of the projection optical system PL has a tilted side surface FS. The nozzle member 20 has an inner side 20T, which opposes the side surface FS of the final optical element FL and is formed so as to follow that side surface FS. The side surface FS of the final optical element FL and the inner side surface 20T of the nozzle member 20 are tilted so that the distance with respect to the substrate P becomes larger as the outer side is approached from the optical path space K of the exposure light EL (as the optical axis of the find optical element FL is moved away from). A first gap G1 is formed between the side surface FS of the final optical element FL and the inner side surface 20T of the nozzle member 20.

A shown in FIG. 3, FIG. 4 and FIG. 5, etc., the nozzle member 20 has liquid supply ports 21, which supply the liquid LQ for forming the liquid immersion space LS, and a first liquid recovery port 22, which recovers the liquid LQ. The liquid supply ports 21 are connected to a liquid supply apparatus 25 via supply flow paths 23 formed at the interior of the nozzle member 20. The first liquid recovery port 22 is connected to a first liquid recovery apparatus 26 via a first recovery flow path 24 formed at the interior of the nozzle member 20. The liquid supply a 25 is able to deliver liquid LQ that is clean and has been temperature adjusted. In addition, the first liquid recovery apparatus 26 includes a vacuum system, etc. and is able to recover the liquid LQ. The liquid supply apparatus 25 is able to supply the liquid LQ for forming the liquid immersion space LS via the liquid supply flow paths 23 and the liquid supply ports 21. The first liquid recovery apparatus 26 is able to recover the liquid LQ of the liquid immersion space LS via the first liquid recovery port 22 and the first recovery flow path 24. Operation of the liquid supply apparatus 25 and the first liquid recovery apparatus 26 is controlled by a control apparatus 3.

The nozzle member 20 has a bottom plate 28, which has an upper surface 29 that opposes a partial area of the lower surface (light emergence surface) of the final optical element FL. A portion of the bottom plate 28 is arranged between the lower surface of the final optical element FL and the substrate P (substrate stage) in relation to the Z axis direction.

In addition, as shown in FIG. 2, FIG. 3, FIG. 4 and FIG. 5, an opening 28K that allows the exposure light EL to pass through is formed at the center of the bottom plate 28. In the present embodiment, at the opening 28K, the cross sectional shape of the exposure light EL (nearly the same shape as the projection area AR) is an approximately rectangular shape (slit shape) that has the X axis direction as the lengthwise direction. The opening 28K is formed in an approximately rectangular shape in the XY direction according to the projection area AR.

In the present embodiment, the lower surface 27 of the nozzle member 20 that opposes the surface of the substrate P held on the substrate stage 2 is flat. The lower surface 27 is provided on the bottom plate 28. The lower surface 27 is nearly parallel to the surface (XY plane) of the substrate P. In the following explanation, the lower surface 27 of the nozzle member 20 is to be called the "land surface 27" as appropriate. The land surface 27 is provided between the lower surface of the final optical element FL of the projection optical system PL and the surface of the substrate P so as to oppose the surface of the substrate P and so as to surround the optical path space K (the opening 28K) of the exposure light EL. In the present embodiment, of the surfaces of the nozzle member 20 that oppose the substrate P, the land surface 27 is provided at the position nearest the substrate P held by the substrate stage 2, and it is able to hold the liquid LQ between itself and the surface of the substrate P. In addition, a space that has a prescribed gap is provided between the lower surface of the final optical element FL and the upper surface 29 of the bottom plate 28.

The liquid supply ports 21 are connected in the space between the lower surface of the final optical element FL and the upper surface 29 of the bottom plate 28 and are able to supply the liquid LQ to that space. In addition, in the present embodiment, the liquid supply ports 21 are provided at the respective prescribed positions of both sides of the X axis direction with respect to the optical path space K.

In addition, in the present embodiment, the exposure apparatus EX comprises a gas supply apparatus 30, which supplies gas to the liquid supply ports 21. The gas supply apparatus 30 is able to deliver gas that is clean and has been temperature adjusted. The gas supply apparatus 30 supplies gas (for example, dry air) that is nearly the same as the gas in the chamber in which the exposure apparatus EX is accommodated. The gas supply apparatus 30 and the liquid supply ports 21 are connected via at least a portion of the supply flow paths 23. The exposure apparatus EX comprises a valve mechanism 31, which switches the connection between the liquid supply apparatus 25 and the gas supply apparatus 30 with respect to the liquid supply ports 21 and the supply flow paths 23. The control apparatus 3 controls the valve mechanism 31 to make the liquid supply ports 21 and the liquid supply apparatus 25 in fluid communication with each other via the supply flow paths 23. Thereby, it is possible to supply the liquid LQ from the liquid supply apparatus 25 to the liquid supply ports 21 and to supply the liquid LQ to the space between the lower surface of the final optical element FL and the upper surface 29 of the bottom plate 28 via those liquid supply ports 21. In addition, at a prescribed timing such as during stoppage of the liquid supply operation, the control apparatus 3 controls the valve mechanism 31 to make the liquid supply ports 21 and the liquid supply apparatus 30 in fluid communication with each other via the supply flow paths 23. Thereby, it is possible to supply gas from the gas supply apparatus 30 to the liquid supply ports 21, and to supply gas to the space between the lower surface of the final optical element FL and the upper surface 29 of the bottom plate 28 via those liquid supply ports 21. For example, after the recovery operation for recovering all of the liquid LQ of the liquid immersion space LS has been performed, by blowing out gas from the liquid supply ports 21, it is possible to remove the liquid LQ that has remained at the end face (light emergence surface) of the final optical element FL (light emergence surface) using that blown out gas, and it is possible to dry, etc. the end face of the final optical element FL. Note that a gas suction apparatus may also be provided instead of a gas supply apparatus 30. In this case, by suctioning gas from the liquid supply ports 21, it will be possible to remove (recover) the liquid LQ that remains at the end face (light emergence surface) of the final optical element FL (liquid emergence surface), and it will be possible to dry the end face of the final optical element FL.

In addition, the nozzle member 20 has discharge ports 32, which discharge (exhaust) the space between the lower surface of the final optical element FL and the upper surface 29 of the bottom plate 28 and gas in the vicinity thereof to an external space (including atmospheric space). The discharge ports 32 and the external space are connected via discharge flow paths 33 formed at the interior of the nozzle member 20. In the present embodiment, the discharge ports 32 are arranged at a position nearer to the optical axis than the liquid supply ports 21 and are arranged at a position nearer to the substrate P than the liquid supply ports 21. In the present embodiment, the discharge ports 32 are formed at the inner side surface 28T of the bottom plate 28 that faces the optical path space K. In the present embodiment, the discharge ports 32 are provided at respective prescribed positions of both sides of the Y axis direction with respect to the optical path space K. The space between the lower surface of the final optical element FL and the upper surface 29 of the bottom plate 28 and the gas in the vicinity thereof can be discharged to the external space via the discharge ports 32 and the discharge flow paths 33.

The first liquid recovery port 22 is arranged above the substrate P held by the substrate stage 2 so as to oppose the surface of the substrate P. A space is formed at the interior of the nozzle member 20. The first liquid recovery port 22 is formed at the lower end of that space, and a portion of the first recovery flow path 24 is formed by that space. The first liquid recovery port 22 is provided at the outer side of the liquid supply ports 21 and the discharge port 32 with respect to the optical path space K (the opening 28K) of the exposure light EL. In addition, the first liquid recovery port 22 is provided at the outer side of the land surface 27 with respect to the optical path space K (the opening 28K) of the exposure light EL. In the present embodiment, the first liquid recovery port 22 is annularly provided so as to surround the optical path space K, the land surface 27, the liquid supply ports 21, and the discharge ports 32.

A porous member 34, which has a plurality of holes, is arranged at the first liquid recovery port 22. The porous member 34 has a lower surface 35 that opposes the substrate P held by the substrate stage 2. In the present embodiment, the lower surface 35 of the porous member 34 is nearly flat. In the present embodiment, the porous member 34 is arranged at the first liquid recovery port 22 so that the lower surface 35 thereof and the XY plane become nearly parallel. Note that the lower surface 35 of the porous member 34 may also be tilted with respect to the XY plane. In addition, in the present embodiment, the lower surface 35 of the porous member 34 is more separated from the surface of the substrate P than the land surface 27. Note that the lower surface 35 of the porous member 34 and the land surface 27 may also be nearly flush. Note that the optimal value (tolerance range) of the pressure of the first recovery flow path 24 can be obtained from, for example, experimentation or simulation.

In this way, the lower surface of the nozzle member 20 includes the land surface 27 and the lower surface 35 of the porous member 34, and the liquid immersion space LS is formed between the lower surface of the final optical element FL, the lower surface of the nozzle member 20, and the surface of the substrate P.

The land surface 27 has lyophilicity with respect to the liquid LQ. In the present embodiment, the bottom plate 28 that forms the land surface 27 is formed of titanium and has lyophilicity (hydrophilicity). In the present embodiment, the contact angle of the liquid LQ at the land surface 27 is 40° or less. Note that surface processing to increase lyophilicity may also be performed on the land surface 27. In addition, in the present embodiment, the porous member 34 is a mesh member made of titanium, and it has lyophilicity (hydrophilicity) with respect to the liquid LQ. Note that surface treatment to increase lyophilicity may also be performed on the porous member 34.

In addition, upper end discharge ports 36 that are able to discharge fluids of the space of the first gap G1 (including at least one of the gas and the liquid LQ) to the external space are formed at prescribed positions of the upper portion of the inner side surface 20T of the nozzle member 20. The upper end discharge port 36 are respectively formed at a plurality of prescribed positions surrounding the final optical element FL at the upper portion of the side surface 20T. The respective upper end discharge ports 36 are in fluid communication with the external space (including atmospheric space) via discharge flow paths 37 formed at the interior of the nozzle member 20. The respective discharge flow paths 37 are formed so as to pass through the interior of the nozzle member 20 in the Z axis direction at the outer side of the first recovery flow path 24 with respect to the optical space K of the exposure light EL. The upper ends of the discharge flow paths 37 are in fluid communication with the space of the first gap G1 via the upper end discharge ports 36, and the lower ends of the discharge flow paths 37 are in fluid communication with the space (external space) between the nozzle member 20 and the substrate P via lower end discharge ports 38. In the present embodiment, the respective inner side surface 20T of the nozzle member 20 and the side surface FS of the final optical element FL have liquid repellency, and they perform restriction so that the surface of the liquid LQ that has gone into the first gap G1 rises to the vicinity of the upper end discharge ports 36. In addition, the space of the first gap G1 and the external space are in fluid communication with the discharge flow paths 37, and the space of the first gap G1 undergoes atmospheric release via the discharge flow paths 37. Through this, large pressure fluctuations of the space of the first gap G1 attributable to the liquid LQ that has gone into the first gap G1 are restricted.

In addition, in the case in which the surface of the liquid LQ has risen to the upper end discharge ports 36, it is possible to discharge the liquid LQ discharge from the lower end discharge ports 38 via the discharge flow paths 37. The liquid LQ that has been discharged from the lower end discharge ports 38 can be recovered from the first liquid recovery port 22 and/or the second liquid recovery ports 41 to be discussed below.

Figure 6:
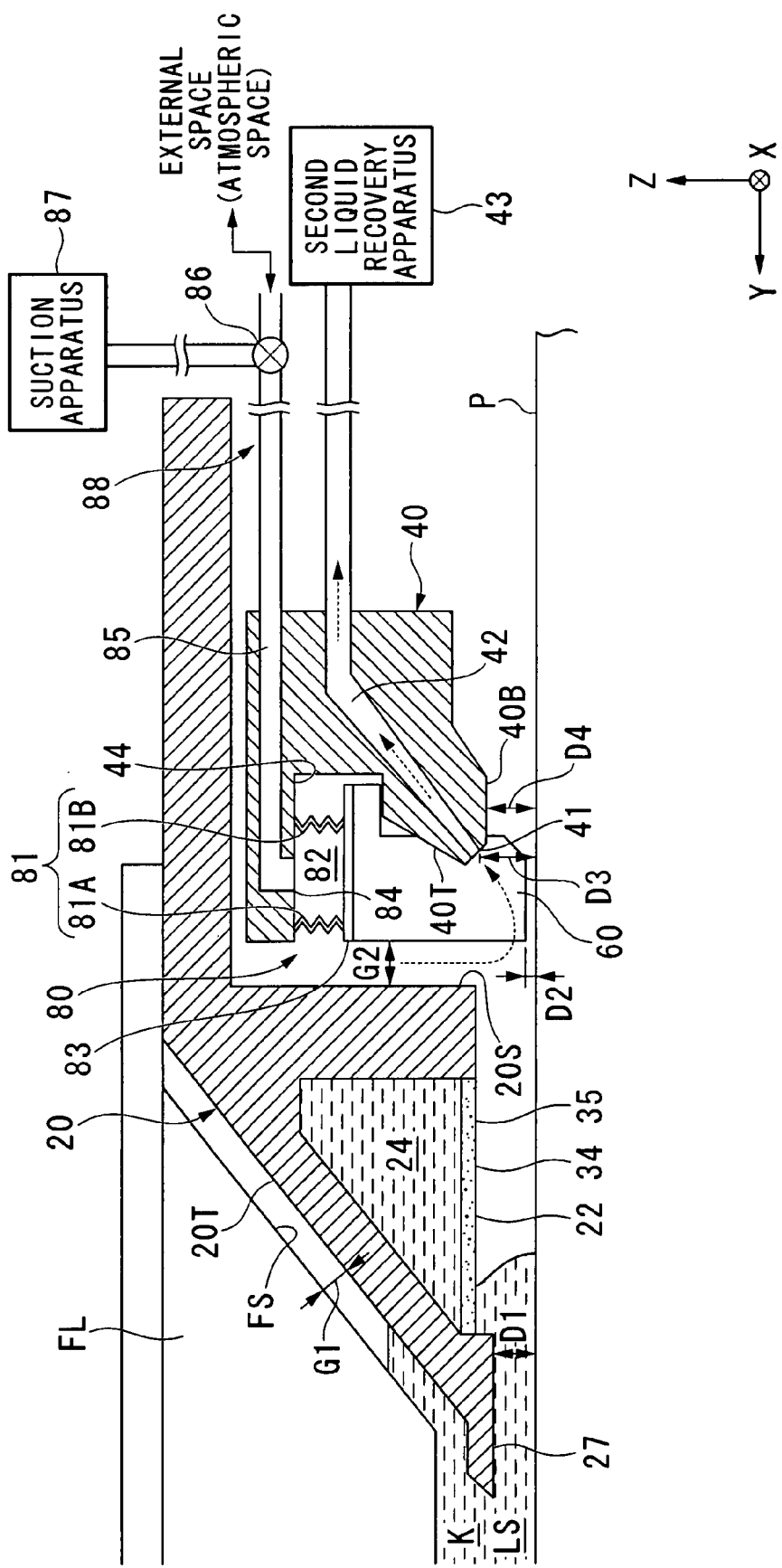
FIG. 6 is a side cross sectional view that shows the vicinity of a trap member relating to the first embodiment.

FIG. 6 is a side cross sectional view that shows the vicinity of the trap members 60, and FIG. 7 is a view of the trap members 60 of FIG. 6 as seen from the +Y side. The exposure apparatus EX comprises trap members 60 that trap the liquid LQ that is present at the surface of the substrate. The trap members 60 are provided so as to be separated from the nozzle member 20 at the outer side of the first liquid recovery port 22 provided on the nozzle member 20 with respect to the optical path space K of the exposure light EL. The trap members 60 are supported by a liquid recovery member 40 provided at the outer side of the nozzle member 20 with respect to the optical path space K of the exposure light EL. The liquid recovery member 40 comprises second liquid recovery ports 41 that are separate from the first liquid recovery port 22. The second liquid recovery ports 41 are provided at the outer side of the first liquid recovery port 22 with respect to the optical path space K of the exposure light EL. As discussed above, in the present embodiment, the distance D2 between the trap members 60 and the substrate P is smaller than the distance D1 between the nozzle member 20 and the substrate P in a status in which at least a liquid immersion space LS is formed.

The exposure apparatus EX comprises a first support mechanism 80, which is connected to the liquid recovery member 40 and supports the trap members 60, and a second support mechanism 90, which is connected to the lens barrel base plate 7 of the first column CL1 and supports the liquid recovery member 40.

As shown in FIG. 1, the second support mechanism 90 supports the liquid recovery member 40 so that it hardly moves at all with respect to the lens barrel base plate 7 of the first column CL1. The second support mechanism 90 is mechanically separated from the nozzle member 20 held by the holding mechanism 70 and supports the liquid recovery member 40.

The first support mechanism 80 movably supports the trap members 60 with respect to the surface of the substrate P. The first support mechanism 80 is mechanically separated from the nozzle member 20 held by the holding mechanism 7 and supports the trap members 60. In addition, the trap members 60, which are supported by the first support mechanism 80, and the liquid recovery member 40 are separated. The trap members 60 are movable in the +Z direction and the −Z direction. Note that the liquid recovery member 40 may also be used as a stopper so that the trap members 60 supported by the first support mechanism 80 do not move (drop) to the −Z side farther than a prescribed position. In addition, the trap members 60 supported by the first support mechanism 80 may also be brought into contact with the liquid recovery member 40 so as to move in the −Z direction.

Note that the second support mechanism 90 may also movably support the liquid recovery member 40 with respect to the lens barrel base plate 7 of the first column CL1. For example, the second support mechanism 90 may also have an elastic body. By the second support mechanism 90 having an elastic body, it a possible to slidably support the liquid recovery member 90 by means of elastic deformation of that elastic body. In addition, the second support mechanism 40 may also comprise an active vibration proofing apparatus that comprises a prescribed actuator or a damper mechanism.

The liquid recovery member 40 is arranged so as to oppose the surface (upper surface 2F of the substrate stage 2) of the substrate P. The liquid recovery member 40 is an annular member, and the liquid recovery member 40 supported by the second support mechanism 90 is arranged above the substrate P (substrate stage 2) so as to surround the nozzle member 20.

The trap members 60 are arranged at the outer side of the nozzle member 20 with respect to the optical path space K so as to interact a plane that includes the optical axis of the final optical element FL. In the present embodiment, the trap members 60 are arranged at the outer side of the optical path space K of the exposure light EL so as to surround the optical path space K of the exposure light EL. In addition, in the present embodiment, a plurality of trap members 60 is arrayed so as to intersect a surface that includes the optical axis of the final optical element FL. As shown in FIG. 5 and FIG. 7, a plurality of trap members 60 is arranged at a prescribed interval along the X axis direction at both sides of the nozzle member 20 in the Y axis direction, and a plurality of trap members 60 is arranged at a prescribed interval along the Y axis direction at both sides of the nozzle member 20 in the X axis direction. Specifically, in the present embodiment, a plurality of trap members 60 is arranged so as to surround the optical path space K. In addition, in the present embodiment, the trap members 60 are a plurality of plate-shaped members (fin-shaped members). A portion of the trap members 60, which are plate-shaped members, is plurally arranged radially with respect to the optical path space K (optical axis AX) of the exposure light EL. More specifically, in the present embodiment, the respective plate-shaped trap members 60 are arranged at both sides of the nozzle member 20 in the Y axis direction so as to become nearly parallel to the YZ plane. The respective plate-shaped trap members 60 are arranged at both sides of the nozzle member 20 in the X axis direction so as to be nearly parallel to the XZ plane.

As shown in FIG. 7, a plurality of second liquid recovery ports 41 is provided so as to surround the optical path space K of the exposure light EL. In the present embodiment, the respective second liquid recovery ports 41 of the plurality are arranged between the adjacent trap members 60 (plate-shaped members). Specifically, in the present embodiment, the respective second liquid recovery port 41 of the plurality are arranged so as to connect to the space between the adjacent trap members 60.

In the present embodiment, the trap members 60 are flexible members. In the present embodiment, the trap members 60 are formed of a material that is soft and has flexibility such as synthetic resin, rubber, etc. In addition, it is preferable that the surfaces of the trap members 60 have lyophilicity (hydrophilicity). For example, in the case in which a soft fluorine resin material such as PTFE (polytetrafluoroethylene) is used as the base material of the trap members 60, it is possible to provide lyophilicity to the surface of that base material due to the fact that electroless plating treatment is performed on that base material. Of course, it is not limited to PTFE, and the trap members 60 may be formed of any material that has flexibility, and it is possible to appropriately perform surface treatment that provides lyophilicity to the surfaces of those trap members 60. In addition, it is not absolutely necessary for the surfaces of the trap members 60 to have lyophilicity (hydrophilicity).

The trap members 60 supported on the first support mechanism 80 are arranged to oppose the surface of the substrate P. The trap members 60 are able to trap (capture) films, drops, etc. of the liquid LQ that is present at the surface of the substrate P without complete recovery by the first liquid recovery port 22.

The second liquid recovery ports 41 of the liquid recovery member 40 are arranged in the vicinity of the trap members 60 and recover the liquid LQ trapped by the trap members 60. In the present embodiment, the second liquid recovery ports 41 are formed at the bottom end of the inner side surface 40T of the liquid recovery member 40. The second liquid recovery ports 41 are connected to the second liquid recovery apparatus 43 via the second recovery flow paths 42 formed at the interior of the liquid recovery member 40. The second liquid recovery apparatus 43 includes a vacuum system, etc. and is able to recover the liquid LQ. The second liquid recovery apparatus 43 is able to recover the liquid LQ that has been trapped by the trap member 60 along with the gas via the second liquid recovery ports 41 and the second recovery flow paths 42. The operations of the second liquid recovery apparatus 43 are controlled by the control apparatus 3.

The first support mechanism 80 includes an elastic body 81, and it movably supports the trap members 60 with respect to the surface of the substrate P. The first support member 80 slidably and softly supports the trap members 60 in the Z axis direction. As shown in FIG. 6, etc., the elastic body 81 of the first support mechanism 80 has an internal space 82 that is filled with the gas. In the present embodiment, the elastic body 81 includes bellows-shaped members. The first support mechanism 80 comprises a first bellows member 81A, which is formed in a rectangular annular shape, a second bellows member 81B, which is formed in a rectangular annular shape and is provided so as to surround the first bellows member 81A, and a support plate member 83, which connects with the respective upper ends of the plurality of trap members 60 and supports that plurality of trap members 60. A plurality of trap members 60 is connected to the lower surface of the support plate member 83, and the first and second bellows members 81A, 81B are connected to the upper surface of the support plate member 83. The first and second bellows members 81A, 81B are provided so as to connect a support surface 44 of the liquid recovery member 40, which opposes the upper surface of the support plate member 83, and the support plate member 83. The respective support surface 44 and the support plate member 83 are formed in a rectangular annular shape. Also, gas is filled into the internal space 82 surrounded by the support surface 44, the support plate member 83, the first bellows member 81A, and the second bellows member 81B.

In the present embodiment, the first support mechanism 80 movably supports a plurality of trap members 60 connected to the support plate member 83 in the Z axis, θX and θY directions. In addition, the first support mechanism 80 supports a plurality of trap members 60 connected to the support plate member 83 so that they hardly move at all in the X axis, Y axis and θZ directions.

In addition, as shown in FIG. 6, etc., the exposure apparatus EX comprises an adjustment apparatus 88, which adjusts the pressure of the internal space 82 of the elastic body 81 of the first support mechanism 80. The adjustment apparatus 88 comprises an exhaust port 84, which is able to exhaust the gas of the internal space 82, an exhaust flow path 85 connected to the exhaust port 84, a valve mechanism 86 provided in the path of the exhaust flow path 85, and a suction apparatus 87, which includes a vacuum system that is provided to be able to connect to the exhaust flow path 85 via the valve mechanism 86 and is able to suction the gas. In addition, by controlling the valve mechanism 86, it is possible to make the exhaust port 84 and the external space (including atmospheric space) in fluid communication with each other via the exhaust flow path 85. Specifically, the valve mechanism 86 is able to switch the connection of the suction apparatus 87 and the external space with respect to the exhaust port 84 and the exhaust flow path 85. The operations of the adjustment apparatus 88, which includes suction apparatus 87 and the valve mechanism 86, are controlled by the control apparatus 3.

The control apparatus 3 is able to adjust the pressure of the gas of the internal space 82 of the elastic body 81 by controlling the adjustment apparatus 88. By adjusting the pressure of the gas of that internal space 82, it is possible to adjust the distance D2 between the trap members 60 and the surface of the substrate P. The control apparatus 3 is able to move the trap members 60 in a direction that approaches (−Z direction) and in a direction that moves away from (+Z direction) the surface of the substrate P using the adjustment apparatus 88, and it is able to adjust distance D2. For example, the control apparatus 3 is able to compress the elastic body 81 in the Z axis direction by controlling the valve mechanism 86 to make the exhaust port 84 and the suction apparatus 87 in fluid communication with each other, driving the suction apparatus 87 to suction the gas of the internal space 82, and bringing the internal space 82 to a negative pressure. It is possible to increase the distance between the trap members 60 and the surface of the substrate P by means of the trap members 60 that are connected to that elastic body 81 via the support plate member 83 moving in the +Z direction by means of the elastic body 81 compressing in the Z axis direction. In addition, the control apparatus 3 is able to set the position of the trap members 60, which connect to that elastic body 81 via the support plate member 83, in the Z axis direction to a prescribed position that corresponds to the elastic force (emerging force) of the elastic body 81 by controlling the valve mechanism 86 to connect the exhaust port 84 and the external space (including atmospheric space) to perform atmospheric release of the internal space 82 (by setting the internal space 82 to nearly atmospheric pressure). Specifically, the control apparatus 3 is able to set the distance between the trap members 60 and the surface of the substrate P to a prescribed value by controlling the valve mechanism 86 to perform atmospheric release of the internal space 82. In the present embodiment, in a status in which at least a liquid immersion space LS has been formed, the internal space 82 of the elastic body 81 undergoes atmospheric release, and, in that status, the distance D2 between the trap members 60 and substrate P is set so as to become smaller than the distance D1 between the nozzle member 20 and the substrate P.

In addition, as shown in FIG. 6, a space that has a second gap G2 through which gas is able to flow is formed between the outer side surface 20S of the nozzle member 20 and the trap members 60.

A discussed above, in the present embodiment, in a status in which at least a liquid immersion space LS is formed, the internal space 82 of the elastic body 81 undergoes atmospheric release, and the distance D2 between the trap members 60 and the substrate P is set to be smaller than the distance D1 between the nozzle member 20 and the substrate P. Specifically, the distance D2 between the lower ends of the trap members 60 and the surface of the substrate P in the Z axis direction is set to be smaller than the distance D1 between the land surface 27 of the nozzle member 20 and the surface of the substrate P in the Z axis direction. The distance D1 between the land surface 27 of the nozzle member 20 and the surface of the substrate P is set to an optimal value according to, for example, the properties (viscosity, etc.) of the liquid LQ, the surface conditions of the substrate P (the contact angle of the liquid LQ, etc.), and the movement conditions of the substrate P (movement velocity, etc.) so that the liquid LQ can be held well between the land surface 27 and the surface of the substrate P. The distance D2 between the lower ends of the trap members 60 and the surface of the substrate P in the Z axis direction is set to an optimal value so that it is possible to trap well thin films, drops, etc. of the liquid LQ that is present at the surface of the substrate P and so that the trap members 60 and the surface of the substrate P do not come into contact even when the substrate P has moved (tilted) in the Z axis, θX and θY directions during exposure.

In addition, in the present embodiment, in a status in which as least a liquid immersion space LS is formed, the distance D2 between the lower ends of the trap members 60 and the surface of the substrate P is smaller than the distance D3 between the second liquid recovery ports 41 of the liquid recovery member 40 and the surface of the substrate P. In addition, the distance D2 between the lower ends of the trap members 60 and the surface of the substrate P is smaller than the distance D4 between the lower surface 40B of the liquid recovery member 40 and the surface of the substrate P. Note that, in the present embodiment, the second liquid recovery ports 41 are formed at the lower end of the inner side surface 40T of the liquid recovery member 40, and distance D3 and distance D4 are nearly equal.

In the present embodiment, the distance D1 between the land surface 27 of the nozzle member 20 and the surface of the substrate P is, for example, approximately 1 mm. In addition, the distance D3 (D4) between the second liquid recovery ports 41 and the surface of the substrate P is also approximately 1 mm. In addition, the distance D2 between the lower ends of the trap members 60 and the surface of the substrate P is approximately 0.3 mm.

In this way, in the present embodiment, the lower ends of the trap members 60 are arranged at positions nearer to the surface of the substrate P than the land surface 27 of the nozzle member 20 and are arranged at positions nearer to the surface of the substrate P than the lower surface 40B of the liquid recovery member 40.

In addition, as shown in FIG. 6 and FIG. 7, the plurality of trap members 60 of the present embodiment are arranged so as to guide the flow of fluid (at least one of the gas or the liquid LQ) toward the second liquid recovery ports 41. In addition, the trap members 60 are arranged to increase the flow rate of the fluid that flows toward the second liquid recovery ports 41.

As shown in FIG. 7, the respective trap members 60, which are plate-shaped members, are plurally arrayed along the surface of the substrate P. It is preferable that the intervals of adjacent trap members 60 be made as small as possible to increase the flow rate of the fluid in the spaces between adjacent trap members 60. In the present embodiment, the thickness of the trap members 60 is approximately 0.5 mm, and the trap members 60 are thin plate-shaped members. In addition, the distance between trap members 60 can be made considerably narrow at approximately 0.1 to 0.2 mm to increase the flow rate of the fluid. In addition, by making the interval between adjacent trap members 60 smaller, it is possible for thin films, drops, etc. of the liquid LQ that is present on the substrate P to be pulled between adjacent trap members 60 by capillary action. So it is possible to more reliably trap thin films, drops, etc. of the liquid LQ that is present on the substrate P.

Note that, in FIG. 5, the trap members 60 are shown in reduced number for simplicity.

The method of exposing the pattern image of the mask M on the substrate P using an exposure apparatus EX that has a configuration discussed above will be explained.

In order to continue to fill the optical path space K of the exposure light EL with the liquid LQ, the control apparatus 3 respectively drives the liquid supply apparatus 25 and the first liquid recovery apparatus 26. The liquid LQ that has been delivered from the liquid supply apparatus 25 is supplied to the space between the lower surface of the final optical element FL and the upper surface 29 of the bottom plate 28 from the liquid supply ports 21 after it has flowed through the supply flow paths 23 of the nozzle member 20. By the liquid LQ being supplied to the space between the lower surface of the final optical element FL and the upper surface 29 of the bottom plate 28, the gas that was present in that space is discharged to the exterior via the discharge ports 32 and the opening 28K.

A liquid immersion (liquid immersion space LS) is formed between the nozzle member 20 and the substrate P so that the liquid LQ that has been supplied to the space between the lower surface of the final optical element FL and the upper surface 29 of the bottom plate 28 flows into the space between the land surface 27 and the substrate P (substrate stage 2) via the opening 28K and fills the optical path space K. At this time, the control apparatus 3 uses the first liquid recovery apparatus 26 to recover a prescribed amount of the liquid LQ per unit time. After the liquid LQ of the space between the land surface 27 and the substrate P has flowed into the first recovery flow path 24 via the first liquid recovery port 22 of the nozzle member 20 and has flowed through that first recovery flow path 24, it is recovered by the first liquid recovery apparatus 26.

In this way, the control apparatus 3 forms a liquid immersion space LS so that, with respect to the optical path space K, a prescribed amount of the liquid LQ per unit time is supplied from the liquid supply ports 21 while a prescribed amount of the liquid LQ per unit time is recovered from the first liquid recovery port 22, and the optical path space K of the exposure light EL between the projection optical system PL and the substrate P is filled with the liquid LQ. Then, the control apparatus 3 projects the pattern image of the mask M onto the substrate P via the projection optical system PL and the liquid LQ of the liquid immersion space LS while relatively moving the projection optical system PL and the substrate P in a status in which the optical path space K of the exposure light EL has been filled with the liquid LQ. The exposure apparatus EX of the present embodiment is a scanning type exposure apparatus that has the Y axis direction as the direction. Accordingly, and the control apparatus 3 controls the substrate stage 2 to move the substrate P at a prescribed velocity in the Y axis direction while performing scanning exposure of the substrate P.

In this type of scanning exposure apparatus, it is not possible to adequately recover the liquid LQ via the first liquid recovery port 22 in conjunction with speeding up of the movement velocity (scanning velocity) of the substrate P, for example, and there is a possibility that a portion of the liquid LQ that has formed the liquid immersion space LS will leak out further to the outer side than the space between the nozzle member 20 and the substrate P. Specifically, there is a possibility that a portion of the liquid LQ will leak out further to the outer side than the first liquid recovery port 22 with respect to the optical path space K.

Figure 8A:
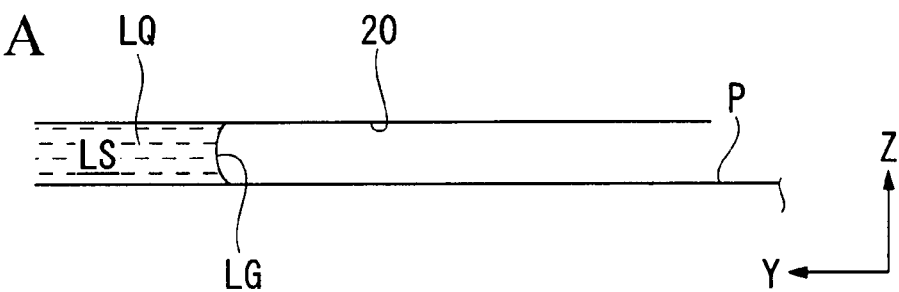
FIG. 8A is a schematic view for explaining an example of the behavior of the liquid.
Figure 8B:
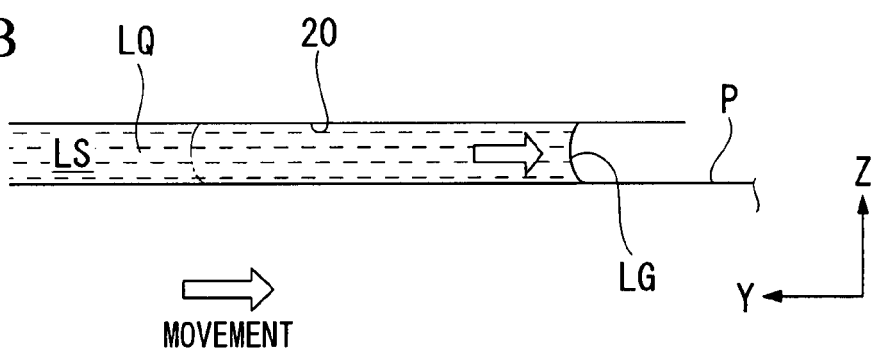
FIG. 8B is a schematic view for explaining an example of the behavior of the liquid.

For example, as shown in the schematic drawing of FIG. 8A, when a liquid immersion space LS has been formed so that the space between the lower surface of the nozzle member 20 and the surface of the substrate P has been filled with the liquid LQ, and the substrate P has been moved in a direction (Y axis direction) with respect to the liquid LQ of that liquid immersion space LS, for example, when at least one of the movement distance and the movement velocity of the substrate P becomes large, there is a possibility that the liquid LQ will leak out. For example, in the case where, from a first status shown in the schematic drawing of FIG. 8A, the substrate P has been moved a short distance at a relatively low velocity in the −Y direction with respect to the liquid LQ of the liquid immersion space LS, as shown in FIG. 8B, it is possible to maintain a second status in which the interface (gas-liquid interface) LG between the liquid LQ of the liquid immersion space LS and the gas space of the outer side thereof moves while the liquid LQ on the substrate P and the nozzle member 20 have come into contact, and flowing out of the liquid LQ does not occur.

Figure 8C:
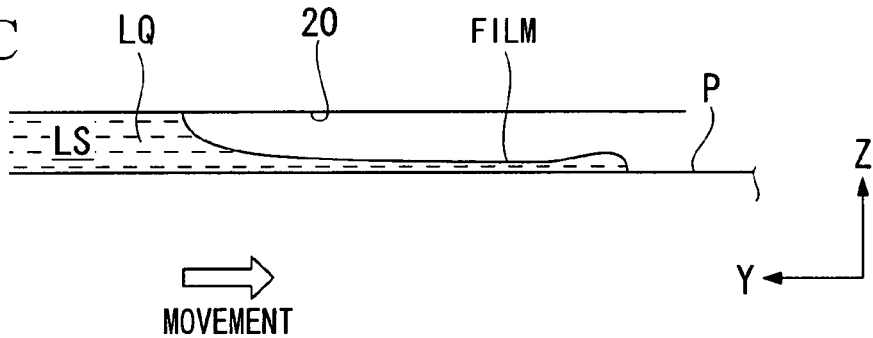
FIG. 8C is a schematic view for explaining an example of the behavior of the liquid.
Figure 8D:
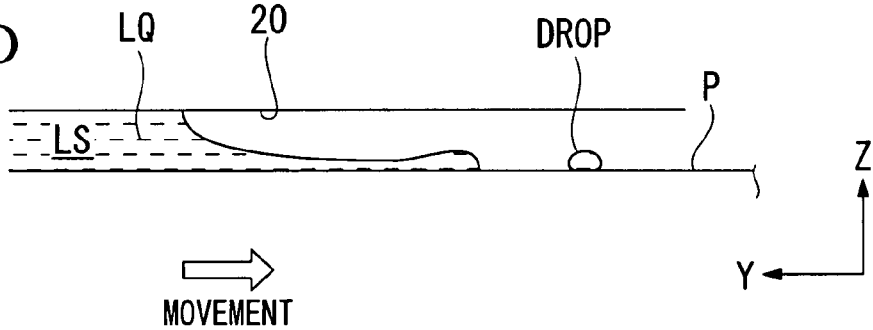
FIG. 8D is a schematic view for explaining an example of the behavior of the liquid.

On the other hand, for example, in the case where, from a first status such as that shown in the schematic drawing of FIG. 8A, the substrate P has moved at a high velocity and/or over a long distance in the −Y direction with respect to the liquid LQ of the liquid immersion space LS, as shown by the schematic drawing of FIG. 8C, there is a possibility that the liquid LQ on the substrate P will move away from the lower surface of the nozzle member 20 and a liquid LQ film (thin film) will be formed on the substrate P in the vicinity of the interface LG of the liquid immersion space LS during movement of the substrate P. Since the liquid LQ film is separate with respect to the lower surface of the nozzle member 20 (the lower surface 35 of the porous material 34 of the first liquid recovery port 22), there is a possibility that a condition in which thin film-shaped liquid LQ cannot be recovered from the first liquid recovery port 22 will be produced. Specifically, since the liquid LQ film formed on the substrate P does not come into contact with the porous member 34 arranged at the first liquid recovery port 22, there is a possibility that thin film-shaped liquid LQ will remain on the substrate P without it being possible to recover it from the first liquid recovery pot 22. In addition, as shown by the schematic drawing of FIG. 8D, there is a possibility of a nonconformity occurring whereby a portion of the liquid LQ film that has formed on the substrate P will be separated on top of the substrate P, and drop-shaped liquid LQ will remain on the substrate P. There is also a possibility that the liquid LQ that has remained on the substrate P will become a cause of exposure defects (pattern defects) and will cause a drop in exposure apparatus EX productivity.

Therefore, in the present embodiment, the liquid LQ (including liquid LQ film, drops, etc.) that is present at the substrate of the substrate P is trapped using the trap members 60 in order to restrict the occurrence of nonconformities such as the liquid LQ remaining. Specifically, thin films, drops, etc. of the liquid LQ on the substrate P, which cannot come into contact with the lower surface of the nozzle member 20, are trapped using the trap members 60.

FIG. 9 is the schematic drawing that shows the status in which the trap members 60 are trapping liquid LQ that is present at the surface of the substrate P in a status in which a liquid immersion space LS is formed. The control apparatus 3 drives the second liquid recovery apparatus 43 to perform a recovery operation (suction operation) that uses the second liquid recovery ports 41 in a status in which at least a liquid immersion space LS is formed. In addition, the control apparatus 3 performs nearly complete atmospheric release of the internal space 82 of the elastic body 81 of the first support mechanism 80 in a status in which at least the liquid immersion space LS is formed to make the distance D2 between the lower ends of the trap member 60 and the surface of the substrate P smaller than the distance D1 between the land surface 27 of the nozzle member 20 and the surface of the substrate P. When the second liquid recovery apparatus 43 is driven to implement the recovery operation (suction operation) of the second liquid recovery ports 41, the flow of the fluid (at least one of the gas or the liquid LQ) toward the second liquid recovery ports is adjusted, and the flow rate of the fluid that flows toward the second liquid recovery ports 41 is increased by means of the trap members 60.

As shown in the schematic drawing of FIG. 9, a liquid LQ film is formed on the substrate P in conjunction with the movement of the substrate P in the −Y axis direction. Even if a condition occurs in which that thin film-shaped liquid LQ cannot all be recovered by the first liquid recovery port 22, the thin film-shaped liquid LQ that is present on the substrate P will be trapped by the trap members 60 arranged at the outer side (−Z side) of the film liquid recovery port 22 with respect to the optical space K. The trap members 60 are arranged at positions nearer to the substrate P than the nozzle member 20, so they are able to trap the liquid LQ that is present on the substrate P without there being complete recovery by the first liquid recovery port 22. Specifically, the distance D2 between the trap members 60 and at the surface of the substrate P is smaller than the distance D1 between the nozzle member 20 and surface of the substrate P, and the trap members 60 are able to come into contact with the liquid LQ film that was not completely recovered by the first liquid recovery port 22. Due to the fact that the liquid LQ is trapped by the trap members 60, the liquid LQ that was not completely recovered by the first liquid recovery port 22 is restricted from the liquid LQ remaining on the substrate P.

The liquid LQ that has been trapped by the trap members 60 is recovered by the second liquid recovery ports 41 arranged in the vicinity of those trap members 60. In the aforementioned way, the trap members 60 are arranged so as to guide the flow of the fluid (at least one of the gas or the liquid LQ) toward the second liquid recovery ports 41 and are arranged so as to increase speed of the fluid that flows toward the second liquid recovery ports 41, so the liquid LQ that has been trapped by the trap members 60 flows into the second liquid recovery ports 41 quickly and smoothly and is recovered by the second liquid recovery apparatus 43. Therefore, the liquid LQ is restricted from remaining on the substrate P and in the trap members 60.

In addition, as shown m FIG. 10, even if a condition occurs in which a portion of the liquid LQ film formed on the substrate P separate to become drop-shaped, and that drop-shaped liquid LQ cannot be completely recovered from the first liquid recovery port 22, the drops of the liquid LQ that are present on the substrate P will be trapped by the trap members 60 arranged at the outer side (−Y side) of the first liquid recovery port 22 with respect to the optical path space K. As discussed above, the trap members 60 are arranged at position nearer to the substrate P than the nozzle member 20, so the drop-shaped liquid LQ that is present on the substrate P can also be trapped. In addition, the liquid LQ that has been trapped by the trap members 60 is quickly and smoothly recovered by the second liquid recovery ports 41.

Here, the case in which the substrate P is moved in the Y axis direction was explained as an example, but there are also cases in which the substrate P is moved in the X axis direction with respect to the liquid immersion space LS, such as in stepping movement, etc. In addition, there are also cases in which the substrate P is moved in direction that is tilted with respect to the Y axis direction within the XY plane with respect to the liquid immersion space LS. In the present embodiment, a plurality of trap members 60 are arranged so as to surround the optical path space K of the exposure light EL, so no matter what direction the substrate P moves in, it will be possible to trap the then film, drops, etc. of the liquid LQ on the substrate P that could not be completely recovered by the first liquid recovery port 22 by means of the trap members 60. So it will be possible to restrict the liquid LQ from on the substrate P. In addition, the second liquid recovery ports 41 are also a so as to surround the optical path space K of the exposure light EL, so it is possible to recover the liquid LQ that has been trapped by the trap members 60 well, and it is also possible to prevent the liquid LQ that has been trapped by the trap members 60 from dropping onto the substrate P.

As explained above, the trap members 60 arranged at positions nearer to the surface of the substrate P than the nozzle member 20, so even if thin film-shaped liquid LQ or drop-shaped liquid LQ were present on the substrate P, it would be possible to trap that liquid LQ using the trap members 60. Therefore, it is possible to prevent the liquid LQ from remaining on the substrate P, and it is also possible to restrict the occurrence of defects of the pattern formed on the substrate P.

In addition, in the present embodiment it is possible to restrict the liquid LQ from remaining on the substrate P, so it is possible to restrict liquid adherence marks (so-called water marks) from forming on the substrate P due to vaporization of the liquid LQ. In addition, it is possible to restrict effects on peripheral equipment and peripheral members caused by the liquid LQ remaining, leaking out, dispersing, etc.

In addition, as discussed above, the distance D2 between the lower ends of the trap members 60 and the surface of the substrate P in the Z axis direction is set to an optimal value so that the liquid LQ that is present on the surface of the substrate P can be trapped well and so that the trap members 60 and the surface of the substrate P do not come into contact even when the substrate P has been moved (tilted) in the Z axis, θX and θY directions in order to set the surface of the substrate P (exposure surface) to the desired positional relationship with respect to the image plane of the projection optical system PL, for example, during exposure. In addition, even if the trap members 60 and the surface of the substrate P come into contact due to a substrate P movement control error, etc, the trap members 60 are slidably supported by the first support mechanism 80, which includes an elastic body 81, and are formed of a soft material that has flexibility, so it is possible to restrict damage to the substrate P and the substrate stage 2, which holds the substrate P, to a minimum.

In addition, as discussed above, in the present embodiment the first support mechanism 80 is able to adjust the distance D2 between the trap members 60 and the surface of the substrate P by adjusting the pressure of the gas of the internal space 82 of the elastic body 81. For example, the control apparatus 3 is able to set the land surface 27 of the nozzle member 20 and the lower ends of the trap members 60 to the desired positional relationship by driving the suction apparatus 87 to adjust the pressure of the internal space 82 of the elastic body 81 to adjust the amount of compression of the elastic body 81 in the Z axis direction.

Figure 11:
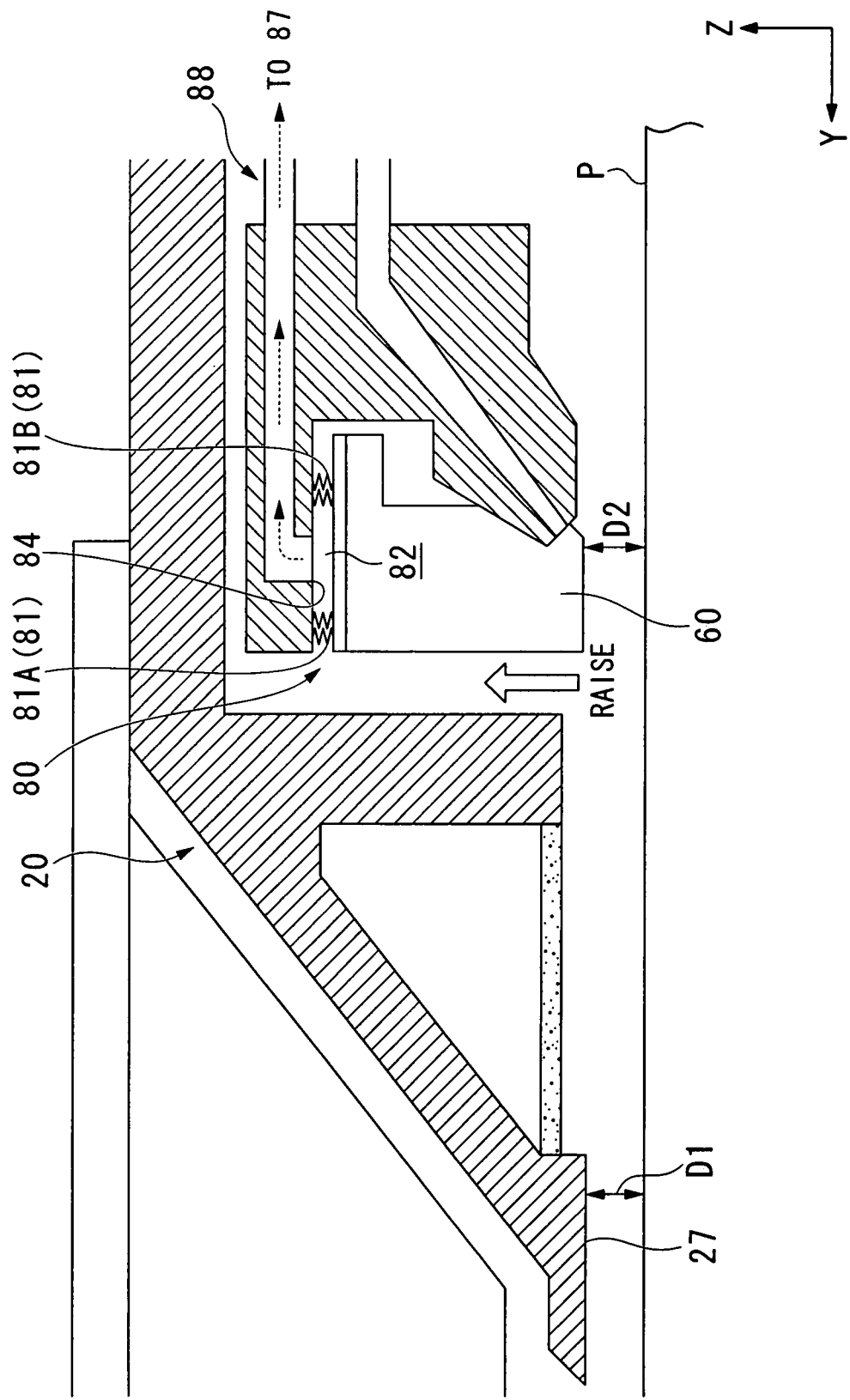
FIG. 11 is a drawing for explaining an example of the operation of a trap member relating to the first embodiment.

In addition, as shown by the schematic drawing of FIG. 11, the control apparatus 3 drives the suction apparatus 87 to bring the internal space 82 of the elastic body 81 to a negative pressure in a status in which, for example, a liquid immersion space LS is not formed. Thereby, it is possible to adjust the positions of the trap members 60 so that the distance D2 between the lower ends of the trap members 60 and the surface of the substrate P becomes larger than the distance D1 between the land surface 27 of the nozzle member 20 and the surface of the substrate P. Specifically, it is possible to arrange the lower ends of the trap members 60 above (+Z side) the land surface 27 of the nozzle member 20 by driving the suction apparatus 87 to compress the elastic body 81. For example, the case where the trap members 60 have been caused to withdraw to above the nozzle member 20 at the time of the initialization operation of the exposure apparatus EX or at the time of exposure apparatus EX maintenance work, etc., it is possible to arrange the trap members 60 at the desired positions by driving the suction apparatus 87 to bring the internal space 82 of the elastic body 81 to a negative pressure. For example, there are cases in which the substrate stage 2 and the second base plate 8 are moved in the Z axis direction by driving the vibration proofing apparatus 10, which includes an actuator and a damper mechanism, at the time of the initialization operation or at the time of maintenance work, etc. In such cases, it is possible to restrict the substrate stage 2 and the trap members 60 from coming into contact by driving the suction apparatus 87 to bring the internal space 82 of the elastic body 81 to a negative pressure to raise the trap members 60.

In addition, for example, in the case where a measuring apparatus that is provided on the substrate stage so that it can be attached and removed and is able to measure the exposure light EL irradiation status is installed on the substrate stage 2, such as that disclosed in Japanese Unexamined Patent Application Publication No. H10-92722, Japanese Unexamined Patent Application Publication No. H11-260706 or Japanese Unexamined Patent Application Publication No. 2001-338868, for example, when the upper surface of the measuring apparatus installed on the substrate stage 2 is arranged more on the +Z side than the upper surface 2F of the substrate stage 2, there is a possibility that that measuring apparatus and the trap members 60 will come into contact. In this way, even in the case where a member that has a different thickness than the substrate P is installed on the substrate stage 2 instead of the substrate P, the control apparatus 3 is able to restrict that member (measuring apparatus, etc.) and the trap members 60 from coming into contact by driving the suction apparatus 87 to bring the internal space 82 of the elastic body 81 to a negative pressure to raise the trap members 60.

Second Embodiment

Next, a second embodiment will be explained. In the explanation below, identical codes are assigned to constituent portions that are the same as or similar to those of the embodiment discussed above, and explanations thereof will be abbreviated or omitted.

Figure 12:
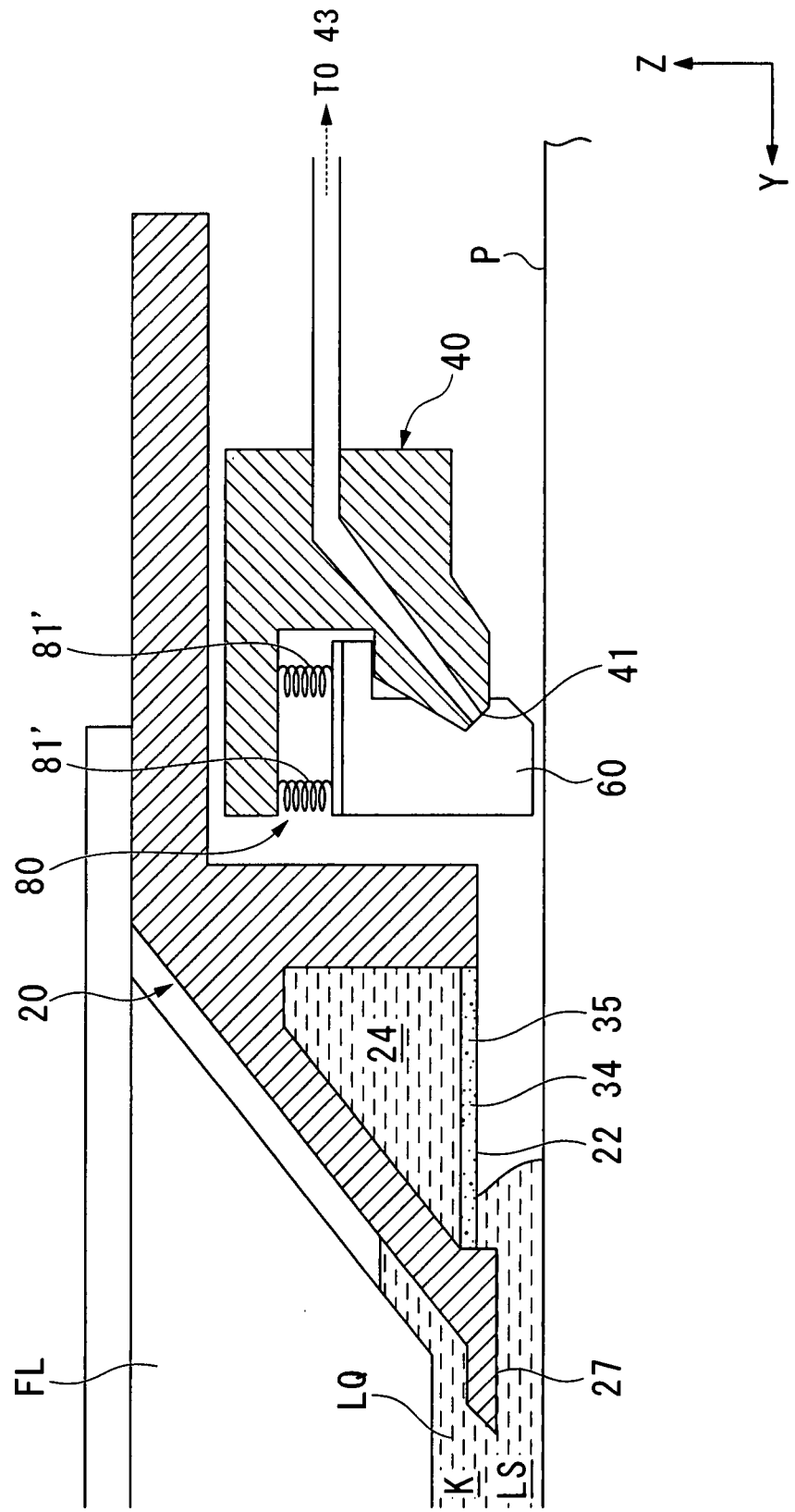
FIG. 12 is a drawing that shows the vicinity of a trap member relating to the second embodiment.

FIG. 12 is an enlarged drawing that shows a portion of the exposure apparatus EX relating to the second embodiment. The second embodiment is a modified example of the first embodiment, and the first support mechanism 80 has spring members (coil spring members) 81' as the elastic body. The first support mechanism 80 uses coil spring members 81' to slidably support the trap members 60. The first support mechanism 80 of the present embodiment does not comprise an elastic body 81 that has an internal space 82, an adjustment apparatus 88, etc. such as those discussed above in the first embodiment. Through this, the first support mechanism 80 is able to slidably support the trap members 60 using a simple configuration.

Note that, in the example shown in FIG. 12, the first support mechanism 80 has coil spring members 81', but it does not have plate spring members, etc. or other elastic bodies. In addition, the first support mechanism 80 is not limited to elastic bodies such as bellows members and spring members, etc., and it may have, for example, hinge mechanisms or flexible members, etc. that have flexibility, such as rubber.

Third Embodiment

Next, a third embodiment will be explained. In the explanation below, identical codes are assigned to constituent portions that are the same as or similar to those of the embodiments discussed above, and explanations thereof will be abbreviated or omitted. The characteristic portion of the present embodiment lies in the fact that the first support mechanism 80 includes a drive apparatus that moves the trap members 60.

Figure 13:
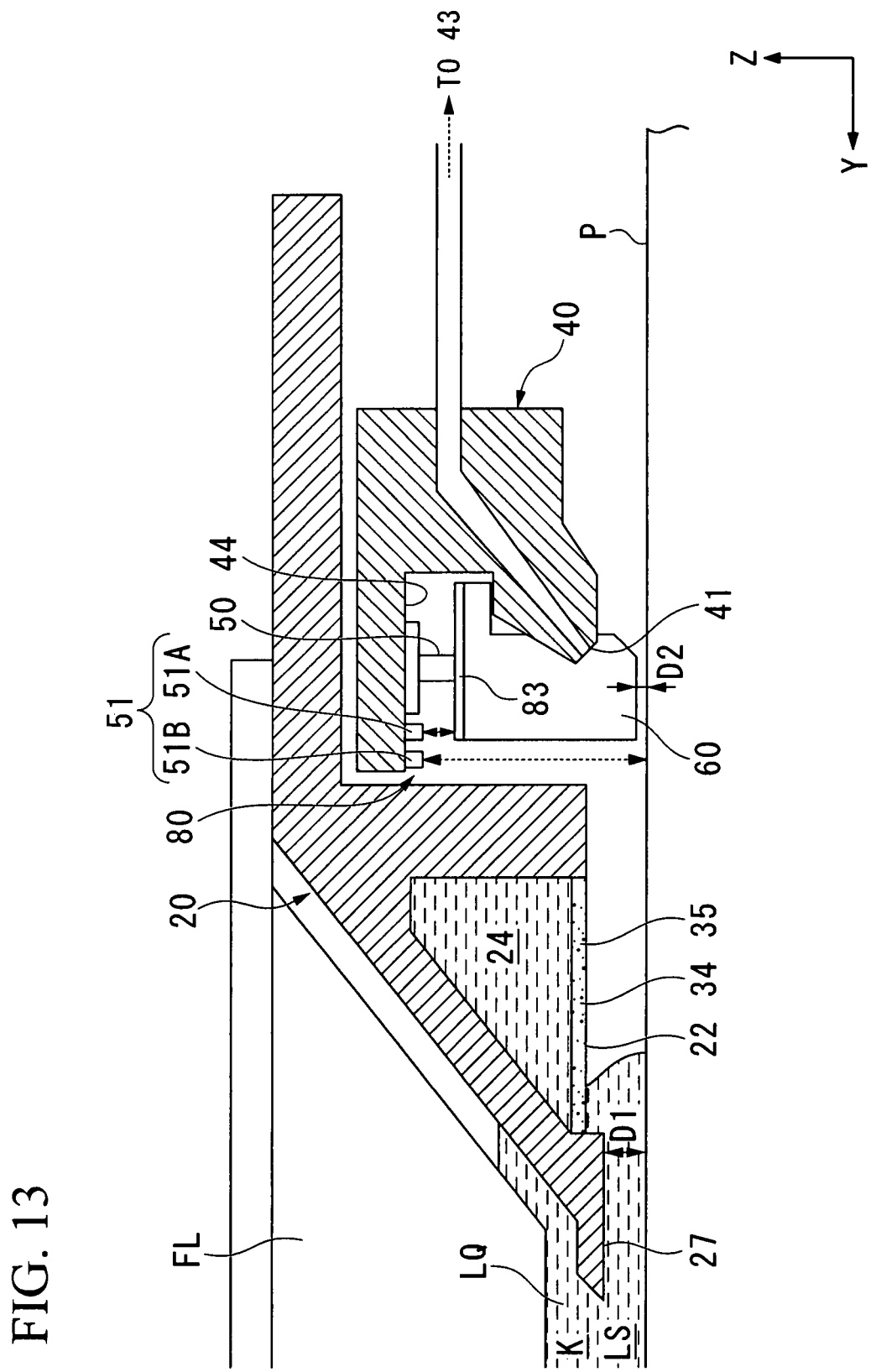
FIG. 13 is a drawing that shows the vicinity of a trap member relating to the third embodiment.

FIG. 13 is an enlarged view that shows a portion of the exposure apparatus EX relating to the third embodiment. In FIG. 13, the first support mechanism 80 comprises a drive apparatus 50, which moves the trap members 60, and a detection apparatus 51, which detects the positional relationship between the trap members 60 and the substrate P. In the present embodiment as well, the first support mechanism 80 is mechanically separated from the nozzle member 20, which is held by a holding mechanism 70, and supports the trap members 60.

The drive apparatus 50 includes a voice coil motor or a linear motor, etc., which performs driving by means of Lorentz force, for example, and it is able to drive the trap members 60 in at least the Z axis, θX and θY directions. The voice coil motor, etc. that performs driving by means of Lorentz force has a coil unit and a magnet unit and performs driving in a non-contact status with that coil unit and magnet unit. Through this, the occurrence of vibration by means of the drive apparatus 50 driving the trap members 60 is restricted.

In the same way as in the embodiment discussed above, a plurality of trap members 60 are connected to a support plate member 83, and the drive apparatus 50 is provided so as to connect the support surface 44 of the liquid recovery member 40 and the support plate member 83. The control apparatus 3 is able to move the plurality of trap members 60 connected to the support plate member 83 in at least the Z axis, θX and θY directions with respect to the support surface 44 of the liquid recovery member 40 by driving the drive apparatus 50.

The detection apparatus 51 comprises a first detection apparatus 51A, which detects the positional relationship between the support surface 44 of the liquid recovery member 40 and the support plate member 83, which supports the trap members 60, and a second detection apparatus 51B, which detects the positional relationship between the support surface 44 of the liquid recovery member 40 and the substrate P held by the substrate stage 2. The first detection apparatus 51A includes a laser interferometer, etc. provided on the support surface 44, and it uses a reflecting surface provided on the upper surface of the support plate member 83 to optically detect the position of the support plate member 83 (and, in turn, the trap members 60) with respect to the support surface 44. The second detection apparatus 51B also optically detects the position of the substrate P with respect to the support surface 44.

The first detection apparatus 51A is able to irradiate detection light respectively to reflecting surfaces provided respectively at a plurality of prescribed positions of the upper surface of the support plate member 83 and detect the position of the support plate member 83, which supports the trap members 60, in relation to the Z axis, θX and θY directions. Here, positional relationship between the upper surface (reflecting surface) of the support plate member 83 and the lower ends of the trap members 60 is already known according to design values, etc., so the first detection apparatus 51A is able to use the reflecting surfaces of the upper surface of the support plate member 83 to detect the position of the lower ends of the trap members 60 in relation to the Z axis, θX and θY directions. In addition, the second detection apparatus 51B is able to irradiate detection light respectively to a plurality of prescribed positions of the surface of the substrate P and detect the position of the surface of the substrate P, which is held by the substrate stage 2, in relation to the Z axis, θX and θY directions. The detection results of the detection apparatus 51, which includes the first and second detection apparatuses 51A, 51B, are output to the control apparatus 3. The control apparatus 3 is able to obtain the positional relationship of the lower ends of the trap members 60 and the surface of the substrate P in relation to the Z axis, θX and θY directions based on the detection results of the detection apparatus 51, specifically, it is able to obtain the distance D2 between the lower ends of the trap members 60 and the surface of the substrate P. Note that, the detection apparatus 51 is not limited to a laser interferometer, and, for example, it is also possible to use a detection apparatus that has another configuration, such as an electrostatic capacitance sensor, an encoder, etc.

The control apparatus 3 maintains a status in which the distance D2 between the trap members 60 and the substrate P is smaller than the distance D1 between the nozzle member 20 and the substrate P while controlling the drive apparatus 50 so that the trap members 60 and the substrate P do not come into contact based on the detection results of the detection apparatus 51 at least while a liquid immersion space LS is formed. Even in the case in which the position and the attitude (tilt) of the substrate P change, such as during scanning exposure of the substrate P, the control apparatus 3 drives the drive apparatus 50 based on the detection results of the detection apparatus 51 so that the distance D2 between the surface of the substrate P and the lower ends of the trap members 60 is maintained to be nearly fixed. Through this, it is possible to restrict the substrate P and the trap members 60 from coming into contact while trapping the liquid LQ using the trap members 60, and it is possible to restrict the liquid LQ from leaking out.

In addition, the control apparatus 3 is able to drive the drive apparatus 50 to cause the trap members 60 to withdraw upward. For example, the control apparatus 3 is able to drive the drive apparatus 50 to adjust the positions of the trap members 60 so that the distance D2 between the lower ends of the trap members 60 and the surface of the substrate P becomes larger than the distance D1 between the land surface 27 of the nozzle member 20 and the surface of the substrate P.

Note that, in the present embodiment, the drive apparatus 50 is used to move the trap members 60 so that the distance D2 between the surface of the substrate P and the lower ends of the trap members 60 is maintained to be nearly fixed, specifically, so that changes in the position and the attitude of the substrate P are followed, but, for example, the drive apparatus 50 may also be used to move the trap members 60 so that the trap members 60 and the substrate P do not come into contact when the distance D2 between the surface of the substrate P and the lower ends of the trap members 60 has become a prescribed value or less due to changes in the position and the attitude of the substrate P.

Fourth Embodiment

Figure 14:
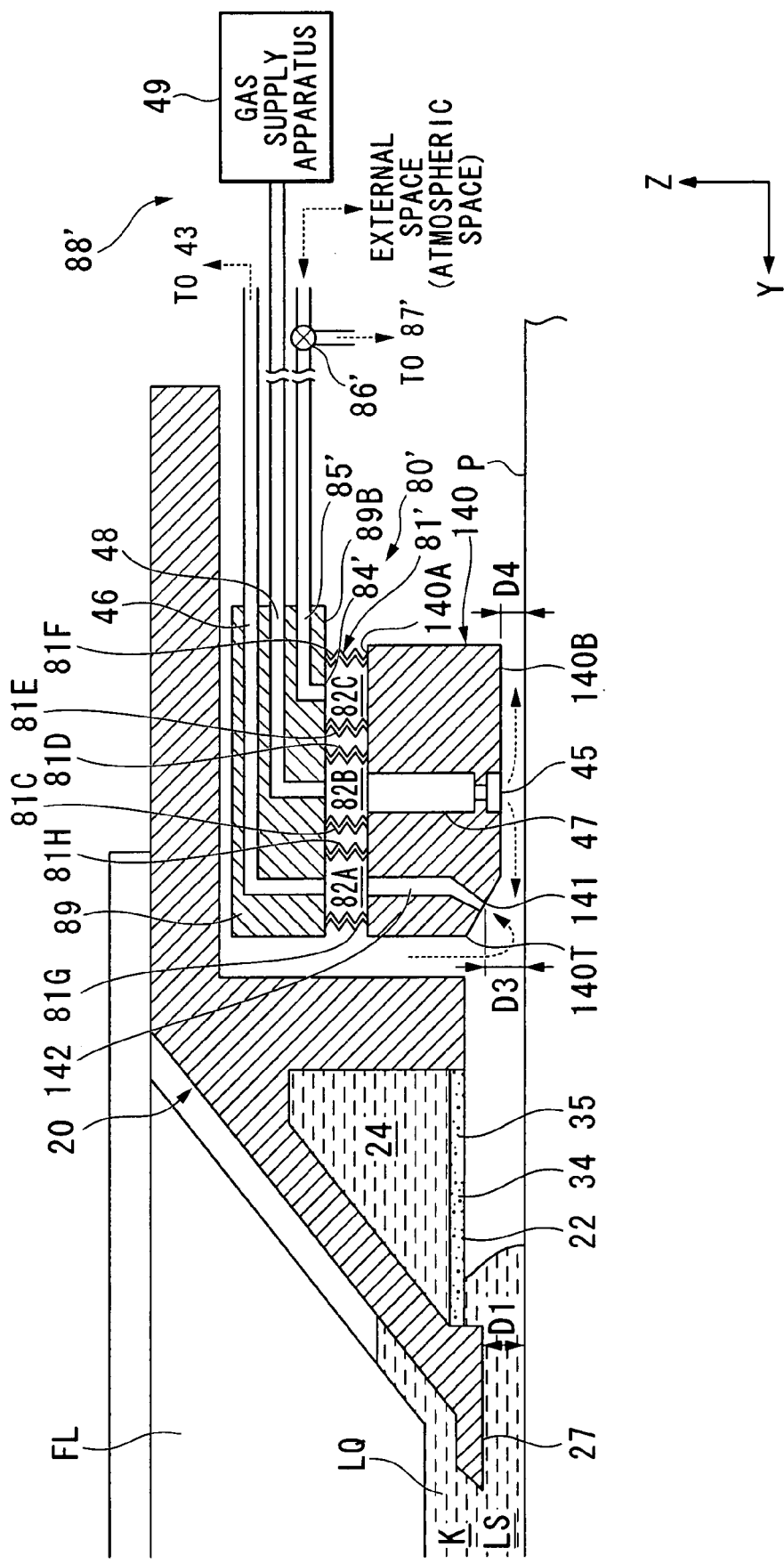
FIG. 14 is a drawing that shows the vicinity of a trap member relating to the fourth embodiment.

Next, a fourth embodiment will be explained. FIG. 14 is an enlarged view that shows a portion of an exposure apparatus EX relating to the fourth embodiment. In the explanation below, identical codes are assigned to constituent portions that are the same as or similar to those of the embodiments discussed above, and explanations thereof will be abbreviated or omitted. In addition, in the present embodiment, trap members are not provided.

In FIG. 14, the exposure apparatus EX comprises a nozzle member 20, which has a first liquid recovery port 22, which is arranged so as to oppose the surface of the substrate P and which forms a liquid immersion space LS between itself and the surface of the substrate P, and a second liquid recovery port 141, which is for recovering the liquid LQ that is present at the surface of the substrate P. In addition, the exposure apparatus EX relating to the present embodiment comprises a gas blow out port 45, which is arranged at the outer side of the second liquid recovery port 141 with respect to the optical path space K of the exposure light EL and blows out gas toward the surface of the substrate P. In addition, in the present embodiment, in a status in which at least a liquid immersion space LS has been formed, the distance D3 between the second liquid recovery port 141 and the surface of the substrate P is smaller than the distance D1 between the nozzle member 20 and the substrate P.

In the present embodiment, the second liquid recovery port 141 is provided on a liquid recovery member 140, and a gas blow out port 45 is also provided on the liquid recovery member 40. The second liquid recovery port 141 is formed at the lower end of the inner side surface 140T of the liquid recovery member 140. The gas blow out port 45 is formed at the lower surface 140B of the liquid recovery member 140, which opposes the surface of the substrate P. The lower surface 140B of the liquid recovery member 140 is nearly parallel to the XY plane. In the present embodiment, the distance D4 between the lower surface 140B of the liquid recovery member 140 and the surface of the substrate P is smaller than the distance D3 between the second liquid recovery port 141 and the surface of the substrate P. Note that the second liquid recovery port 141 may be such that one is continuously arranged so as to surround the nozzle member 20, or it may be such that a plurality is arranged in a dispersed manner so as to surround the nozzle member 20.

The exposure apparatus EX comprises a support mechanism 80', which movably supports the liquid recovery member 140 with respect to the surface of the substrate P. The support mechanism 80' includes an elastic body 81'. The elastic body 81' includes bellows members. The support mechanism 80' comprises a first bellows member 81G, which is formed in a rectangular shape, a second bellows member 81H, which is formed in a rectangular annular shape and is provided so as to surround the first bellows member 81G, a third bellows member 81C, which is formed in a rectangular annular shape and is provided so as to surround the second bellows member 81H, a fourth bellows member 81D, which is formed in a rectangular annular shape and is provided so as to surround the third bellows member 81C, a fifth bellows member 81E, which is formed in a rectangular annular shape and is provided so as to surround the fourth bellows member 81D, and a sixth bellows member 81F, which is formed in a rectangular annular shape and is provided so as to surround the fifth bellows member 81E. In addition, the support mechanism 80' has a support structure body 89, which supports the liquid recovery member 140 via the first to sixth bellows members 81C to 81H. The support structure body 89 is connected to the lens barrel base plate 7 of the first column CL1. The support structure body 89 and the nozzle member 20 are separated.

The first to sixth bellows members 81C to 81H are provided so as to connect the upper surface 140A of the liquid recovery member 140 and the support surface 89B of the support structure body 89 that opposes the upper surface 140A of that liquid recovery member 140. The upper surface 140A of the liquid recovery member 140 and the support surface 89B of the support structure body 89 are respectively formed in a rectangular annular shape. In addition, a first internal space 82A is formed between the first bellows member 81G and the second bellows member 81H, a second internal space 82B is formed between the third bellows member 81C and the fourth bellows member 81D, and a third internal space 82C is formed between the fifth bellows member 81E and to the sixth bellows member 81F. The support mechanism 80', which includes the first to sixth bellows members 81C to 81H and the support structure body 89, is mechanically separated from the nozzle member 20, which is held by the holding mechanism 70, and supports the liquid recovery member 140.

The second liquid recovery port 141 of the liquid recovery member 140 is connected to the second liquid recovery apparatus 43 via a second recovery flow path 142, which is formed at the interior of the liquid recovery member 140, a first internal space 82A, and a recovery flow path 46, which is formed in the support structure body 89. The second liquid recovery apparatus 43 is able to recover the liquid LQ via the second liquid recovery port 141, the second recovery flow path 142, the first internal space 82A and the recovery flow path 46.

The gas blow out port 45 of the liquid recovery member 140 is connected to a gas supply apparatus 49 via a gas supply flow path 47, which is formed at the interior of the liquid recovery member 140, the second internal space 82B, and a gas supply flow path 48, which is formed in the support structure body 89. The gas supply apparatus 49 is able to supply gas that is clean and has been temperature adjusted to the gas blow out port 45. The gas supply apparatus 49 supplies gas (for example, dry air) that is nearly the same as the gas within the chamber where the exposure apparatus EX is accommodated. The operations of the gas supply apparatus 49 are controlled by the control apparatus 3. The control apparatus 3 delivers gas from the gas supply apparatus 49 and blows out gas from the gas supply port 45 toward the surface of the substrate P. A gas bearing is formed in the space between the lower surface 140B of the liquid recovery member 140 and the surface of the substrate P by blowing out gas from the gas blow out port 45 provided at the lower surface 40B of the liquid recovery member 140.

In addition, the exposure apparatus EX comprises an adjustment apparatus 88', which adjusts the pressure of the gas of the third internal space 82C of the support mechanism 80'. In the same way as in the embodiment discussed above, the adjustment apparatus 88' comprises an exhaust port 84', which is able to suction the gas of the third internal space 82C, an exhaust flow path 85', which is connected to the exhaust port 84', a valve mechanism 86', which is provided along the path of the exhaust flow path 85', and a suction apparatus 87', which is provided so as to be able to connect to the exhaust flow path 85' via the valve mechanism 86' and includes a vacuum system that is able to suction gas. In addition, it is possible to make the exhaust port 84' and the external space (atmospheric space) in fluid communication with each other via the exhaust flow path 85' by controlling the valve mechanism 86'. The control apparatus 3 is able to drive the valve mechanism 86' to adjust the pressure of the gas of the third internal space 82C of the elastic body 81'. By adjusting the pressure of the gas of that third internal space 82C, it is possible to adjust the distance D4 between the liquid recovery member 140 and the surface of the substrate P. In addition, the control apparatus 3 is able to control the valve mechanism 86' to make the exhaust port 84' and the external space (atmospheric space) in fluid communication with each other to perform atmospheric release of the third internal space 82C.

The support mechanism 80', which includes elastic body 81', slidably (movably) supports the liquid recovery member 140 with respect to the Z axis, θX and θY directions. In addition, the support mechanism 80' supports the liquid recovery member 140 so that it is unable to move in the X axis, Y axis and θZ directions. The liquid recovery member 140 is slidably supported by the support mechanism 80', so it is able to maintain the gap of the distance D4 between the lower surface 140B of the liquid recovery member 140 and the surface of the substrate P while following the movements (position and attitude) of the substrate P without coming into contact with the substrate P by means of a gas bearing being formed between the lower surface 140B of the liquid recovery member 140 and the surface of the substrate P. Therefore, even in the case in which the substrate P has moved in the Z axis, θX and θY directions, the liquid recovery member 140 is able to maintain the distance D4 between the lower surface 140B thereof and the surface of the substrate P so as to be nearly fixed. Specifically, the liquid recovery member 140 is able to restrict contact between the substrate P and the liquid recovery member 140 while maintaining the minute gap of distance D4 while restricting contact between the substrate P and the liquid recovery member 140 even in the case in which the substrate P has moved in the Z axis, θX and θY directions by means of the action (elastic action of the elastic body 81') of the support mechanism 80', which is supported without contact with respect to the surface of the substrate P and which slidably supports the liquid recovery member 140, and the action of the gas bearing (action of the gas layer formed between the lower surface 140B of the liquid recovery member 140 and the surface of the substrate P).

In addition, the support mechanism 80' is supported in a status in which the nozzle member 20 and the liquid recovery member 140 are separated. So even if the liquid recovery member 140, which is supported by the support mechanism 80', shakes, there is no collision between the nozzle member 20 and the liquid recovery member 140.

In the present embodiment, in a status in which at least the liquid immersion space LS is formed, the distance D3 between the second liquid recovery port 141 provided on the liquid recovery member 140 and the surface of the substrate P is smaller than the distance D1 between the nozzle member 20 and the surface of substrate P. So it is possible to smoothly recover the liquid LQ (including films and drops of the liquid LQ) that is present on the substrate P by means of the second liquid recovery port 141 without there being complete recovery by the first liquid recovery port 22 of the nozzle member 20.

In addition, a gas blow out port 45 is provided at a position that opposes the surface of the substrate P, and it blows out gas toward the surface of the substrate P. A gas layer (film) that has high pressure is formed between the lower surface 140B of the liquid recovery member 140 and the surface of the substrate P by means of the gas blown out from the gas blow out port 45. For this reason, it is possible to prevent outflow of the liquid LQ by means of that gas layer that has high pressure. In addition, since the distance D4 between the lower surface 140B of the liquid recovery member 140 and the surface of the substrate P is extremely small. Even if, for example, thin films, drops, etc. of the liquid LQ are formed on the substrate P, it is possible to restrict that liquid LQ from leaking more to the outer side than the liquid recovery member 40 with respect to the optical path space K.

In addition, after a portion of the gas that has been blown out from the gas blow out port 45 has been blown to the substrate P, a gas flow toward the optical path space K is produced along the surface of the substrate P. Due to a gas flow toward the optical path space K being produced, through the force of that gas, it is possible to bring the thin film and/or drops of the liquid LQ formed on the substrate P near the second liquid recovery port 141, and it is possible to more smoothly recover the thin film-shaped and/or drop-shaped liquid LQ formed on the substrate P. In this way, it is possible to prevent the liquid LQ from remaining on the substrate P by means of the second liquid recovery port 141 provided at a position near the surface of the substrate P and the gas that is blown out from the gas blow out port 45.

Figure 15:
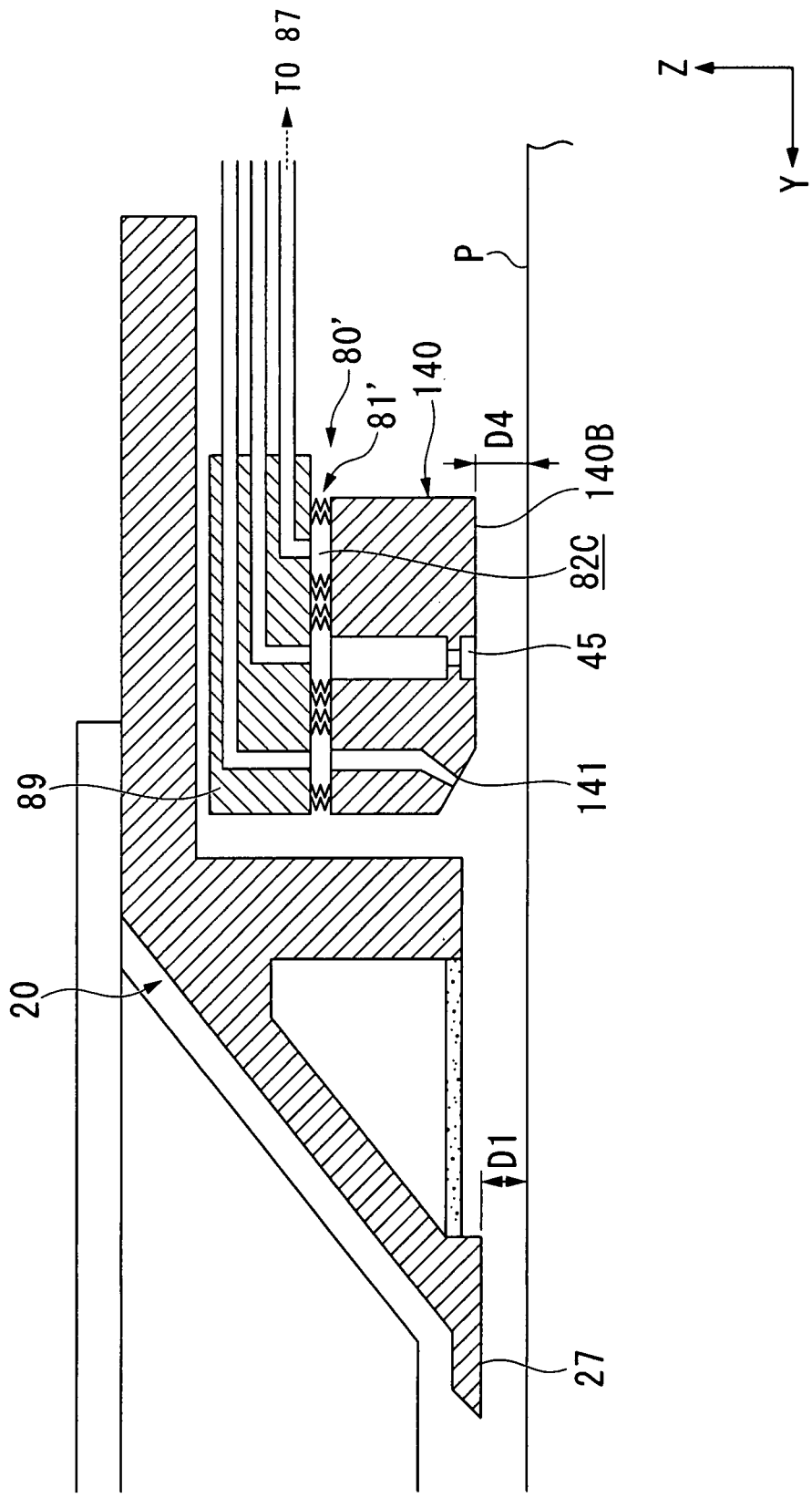
FIG. 15 is a drawing for explaining an example of the operation of a trap member relating to the fourth embodiment.

In addition, as shown in the schematic drawing of FIG. 15, the control apparatus 3 is able to use the suction apparatus 87' to adjust the position of the liquid recovery member 140 by adjusting the pressure of the third internal space 82C of the support mechanism 80'. By driving the suction apparatus 87' to adjust the pressure of the third internal space 82C of the elastic body 81' and adjust the amount of compression of the elastic body 81' in the Z axis direction, it is possible to adjust the position of the liquid recovery member 140 in the Z direction. Therefore, for example, in the case in which it is desired that the lower surface of the liquid recovery member 140 be caused to withdraw to above the lower surface of the nozzle member 20 at the time of the initialization operation of the exposure apparatus ES or at the time of exposure apparatus EX maintenance work, by driving the suction apparatus 87' to bring the third internal space 82C of the elastic body 81' to a negative pressure, it is possible to adjust the position of the liquid recovery member 140 so that the distance D4 between the surface of the substrate P and the lower surface 140B of the liquid recovery member 140 is larger than the surface of the substrate P and the land surface 27 of the nozzle member 20.

In addition, for example, even in a status in which there is no substrate P at a position that opposes the lower surface 140B of the liquid recovery member 140, the control apparatus 3 uses the suction apparatus 87' to bring the third internal space 82C of the elastic body 81' to a negative pressure. Thereby, it is possible to adjust the position of the liquid recovery member 140 so that the lower surface 140B of the liquid recovery member 140 is arranged above the land surface 27 of the nozzle member 20. For example, after liquid immersion exposure of the substrate P has ended, in the case in which the substrate stage 2, which held the substrate P, is moved to the substrate replacement position to unload the substrate P on the substrate stage 2, there is a possibility that the substrate P (or an object such as the substrate stage 2) for forming a gas bearing between itself and the lower surface 140B of the liquid recovery member 140 will move to a position that does not oppose the lower surface 140B of the liquid recovery member 140. When there is no substrate P at a position that opposes the lower surface 140B of the liquid recovery member 140, there is a possibility that liquid recovery member 140 will descend (vertical descent) and that a nonconformity in which peripheral equipment collides with peripheral members will occur. In the present embodiment, the control apparatus 3 is able to adjust the position of the lower surface 140B of the liquid recovery member 140 in the Z axis direction by using the suction apparatus 87' to bring the third internal space 82C of the elastic body 81' to a negative pressure. So it is possible to restrict the liquid recovery member 140 from descending (vertically descending) even in a status in which the liquid recovery member 140 is not in opposition with an object such as the substrate P. Of course, even if the status is such that the substrate P is in a position that opposes the lower surface 140B of the liquid recovery member 140, the control apparatus 3 is able to adjust the position of the lower surface 140B of the liquid recovery member 140 in the Z axis direction by using the suction apparatus 87' to adjust the third internal space 82C of the elastic body 81'.

Note that, in the present invention, it is not necessary that the gas blow out port 45 be continuously provided so as to surround the liquid recovery member 140, but it may also be arranged in a dispersed manner so as to surround the liquid recovery member 140.

Fifth Embodiment

Next, a fifth embodiment will be explained. In the explanation below, identical codes are assigned to major constituent portions that are the same as or similar to those of the embodiments discussed above, and explanations thereof will be abbreviated or omitted. The fifth embodiment is a modified example of the fourth embodiment discussed above, and the characteristic portion of the fifth embodiment lies in the point that trap members 160 are arranged in the vicinity of the second liquid recovery port 141 of the liquid recovery member 140.

Figure 16:
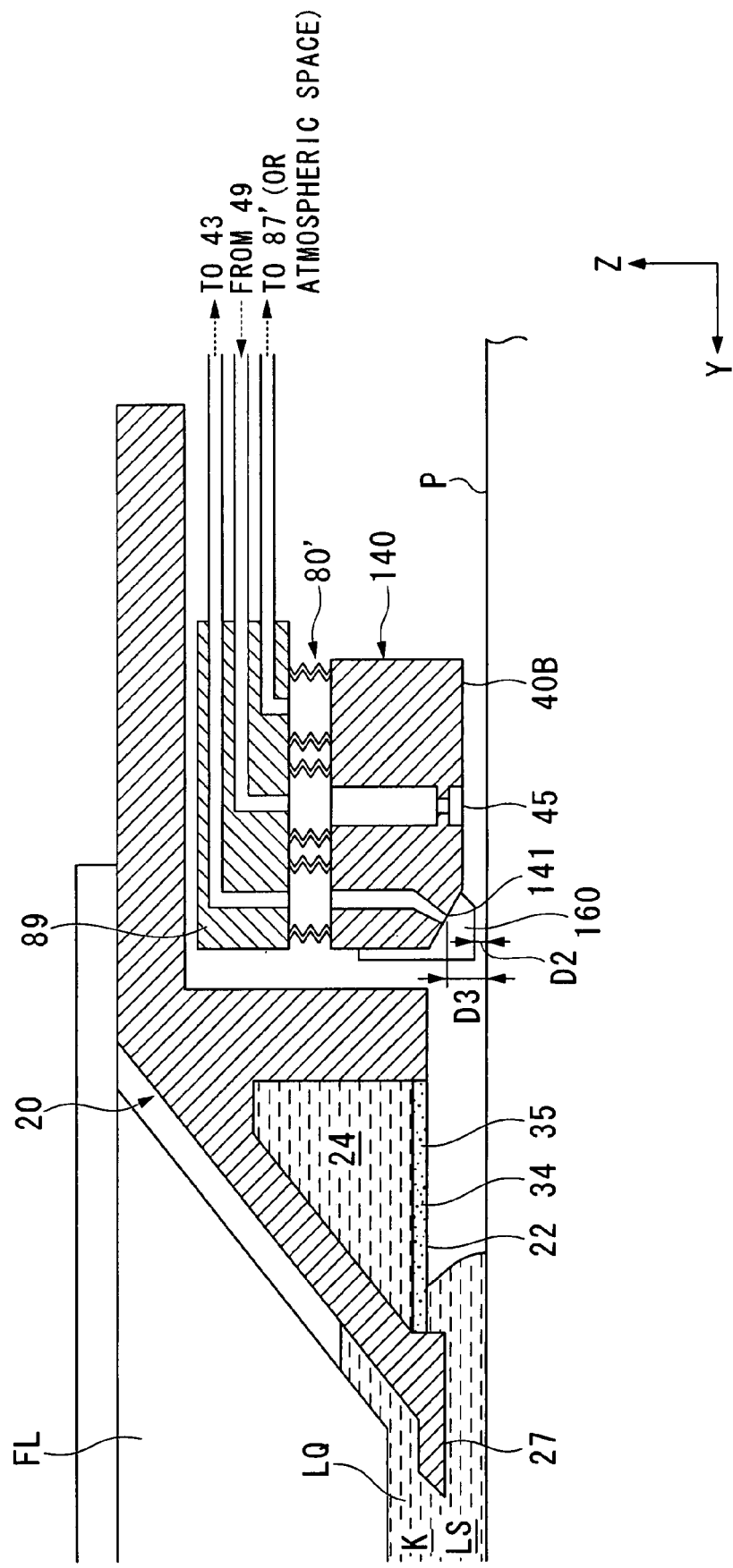
FIG. 16 is a drawing that shows the vicinity of a trap member relating to the fifth embodiment.

FIG. 16 is an enlarged drawing that shows a portion of the exposure apparatus EX relating to the fifth embodiment. In FIG. 16, the trap members 160 are supported by the liquid recovery member 140. The liquid recovery member 140, which supports the trap members 160 has a second liquid recovery port 141, which recovers the liquid LQ that is present on the substrate P in the same way as the fourth embodiment discussed above, and a gas blow out port 45, which is provided on the lower surface 140B that opposes the surface of the substrate P. The distance D2 between the lower ends of the trap members 160 and the surface of the substrate P is smaller than the distance D3 between the second liquid recovery port 141 and the surface of the substrate P. The trap members 160 are arranged in the vicinity of the second liquid recovery port 141, and the liquid LQ that has been trapped by the trap members 160 is recovered by the second liquid recovery port 141.

The gas blow out port 45 is provided at the outer side of the second liquid recovery port 140 and the trap members 160 arranged in the vicinity thereof with respect to the optical path space K of the exposure light EL. In the present embodiment as well, the gas blow out port 45 blows out gas toward the surface of the substrate P. In addition, a gas bearing is formed in the space between the surface of the substrate P and the lower surface 140B of the liquid recovery member 140, which supports the trap members 160 by blowing out gas from the gas blow out port 45.

As explained above, it is possible to support the trap members 160 using the liquid recovery member 140, which comprises the second liquid recovery port 141 and the gas blow out port 45, and it is possible to further restrict leaking out of the liquid LQ.

In addition, it is possible to bring the thin film-shaped and/or drop-shaped liquid LQ on the substrate P near the trap members 160 by means of the gas blown out from the gas blow port 45, and it is possible to cause that liquid LQ to come into contact with the trap members 160. Through this, the trap members 160 are able to trap the liquid LQ well.

Sixth Embodiment

Next, a sixth embodiment will be explained. In the explanation below, identical codes are assigned to major constituent portions that are the same as or similar to those of the embodiments discussed above, and explanations thereof will be abbreviated or omitted. The sixth embodiment is a modified example of the first embodiment discussed above, and the characteristic portion of the sixth embodiment lies in the point that the gas blow out port, which blows out gas toward the surface of the substrate P, is provided at a member that is separate from the liquid recovery member 40 that is provided with the second liquid recovery port 41.

Figure 17:
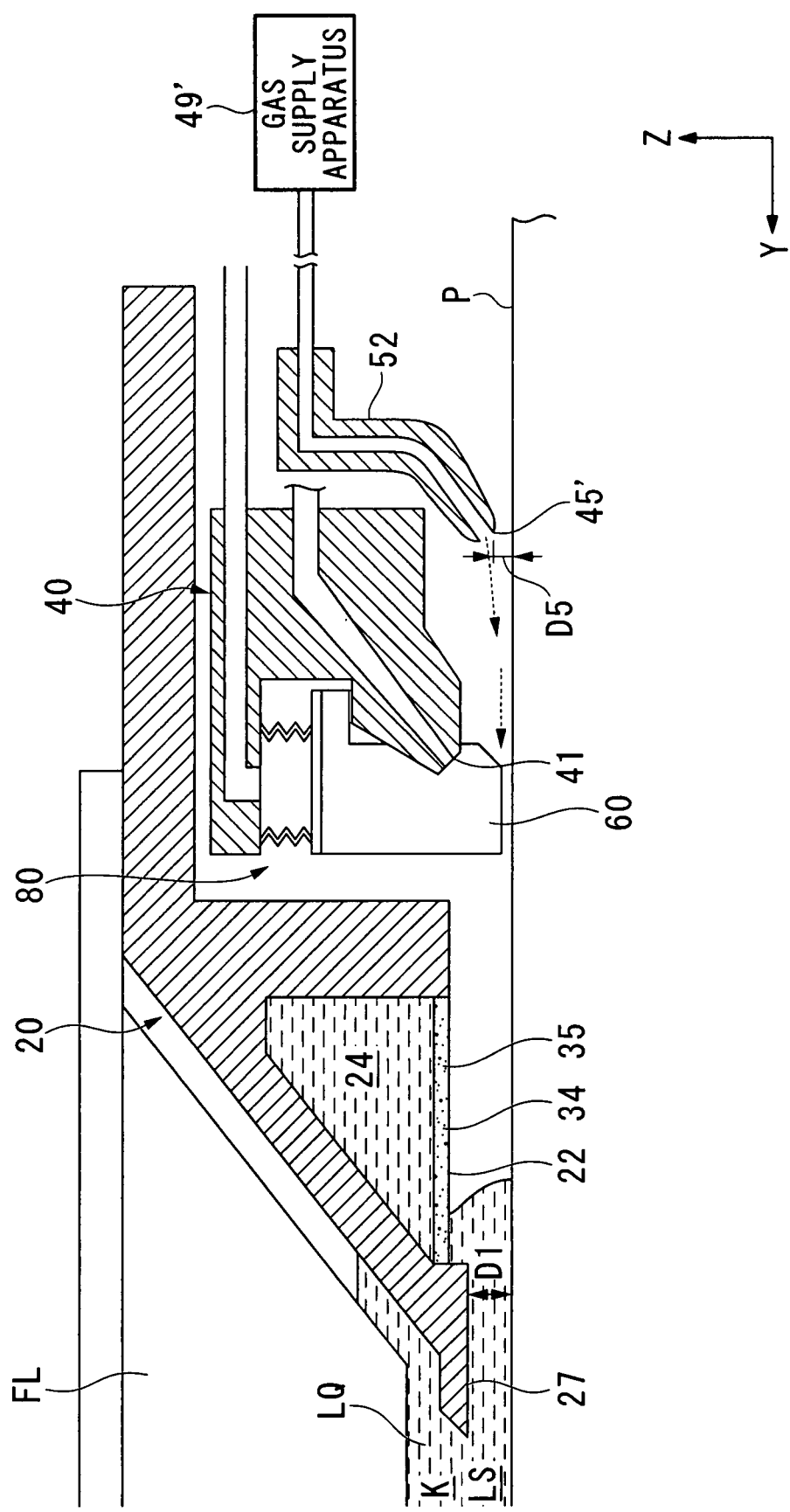
FIG. 17 is a drawing that shows the vicinity of a trap member relating to the sixth embodiment.

FIG. 17 is an enlarged drawing that shows a portion of the exposure apparatus EX relating to the sixth embodiment. In FIG. 17, the exposure apparatus EX, in the same way as the embodiments discussed above, has a liquid recovery 40, which has a second liquid recovery port 41, and trap members 60 which are supported by the liquid recovery member 40 via the first support mechanism 80. The liquid recovery member 40, the first support mechanism 80, the trap members 60, etc. of the present embodiment are similar to those of the first embodiment discussed above.

The exposure apparatus EX has a gas blow out port 45', which is provided at the outer side of the trap member 60 with respect to the optical path space K of the exposure light EL and blows out gas toward the surface of the substrate P. In the present embodiment, the gas blow out port 45' is provided on a gas nozzle member 52 that is separate from the liquid recovery member 40. The gas blow out port 45' of nozzle member 52 is provided at the outer side of the trap members 60 and the second liquid recovery port 41 with respect to the optical path space K of the exposure light EL. The nozzle member 52 is an annular member, and it is provided above substrate P (substrate stage 2) so as to surround the liquid recovery member 40.

The nozzle member 52 has a protruding part that is tilted with respect to the surface of the substrate P, and the gas blow out port 45' is provided at nearly the front end of that protruding part. The protruding part of the nozzle member 52 is tilted so that the distance with respect to the substrate P becomes larger as the outer side is approached from the optical path space K of the exposure light EL. In the present embodiment, the gas blow out port 45' is formed in an annular shape so as to surround the optical path space K and the second liquid recovery port 41, and it is formed in a slit shape that has a prescribed slit width. The gas blow out port 45' is provided above the substrate P, which is held by the substrate stage 2, at a position that opposes the surface of that substrate P. The distance D5 between the gas blow out port 45' and the surface of the substrate P is nearly the same as the distance D1 between the land surface 27 and the surface of the substrate P or is smaller than distance D1.

Note that the gas blow out port 45' need not be provided continuously so as to surround the second liquid recovery member 40 but may also be arranged in a dispersed manner so as to surround the second liquid recovery member 40.

Gas is supplied from a gas supply apparatus 49' to the gas blow out port 45'. The gas blow out port 45' blows out gas toward the optical path space K in a diagonal direction with respect to the substrate P. After a portion of the gas that is blown out from the gas blow out port 45' has been blown to the substrata P, a gas flow toward the optical path space K is produced along the surface of the substrata P. Due to a gas flow toward the optical path space K being produced, through the force of that gas, it is possible to bring the thin film and/or drops of the liquid LQ on the substrate P near the trap members 60, and it is possible to bring that liquid LQ into contact with the trap members 60. Through this, the trap members 60 are able to trap the liquid LQ well. In addition, by providing a gas blow out port 45' on a nozzle member 52 that is separate from the liquid recovery member 40 and by providing a drive apparatus that is able to move the nozzle member 52 for example, it is possible to use that drive apparatus to adjust the positional relationship between the gas blow out port 45' of the nozzle member 52 and at least one of the optical path space K, the nozzle member 20, the trap members 60 or the liquid member 40.

Seventh Embodiment

Next, a seventh embodiment will be explained. In the explanation below, identical codes are assigned to major constituent portions that are the same as or similar to those of the embodiments discussed above, and explanations thereof will be abbreviated or omitted.

Figure 18:
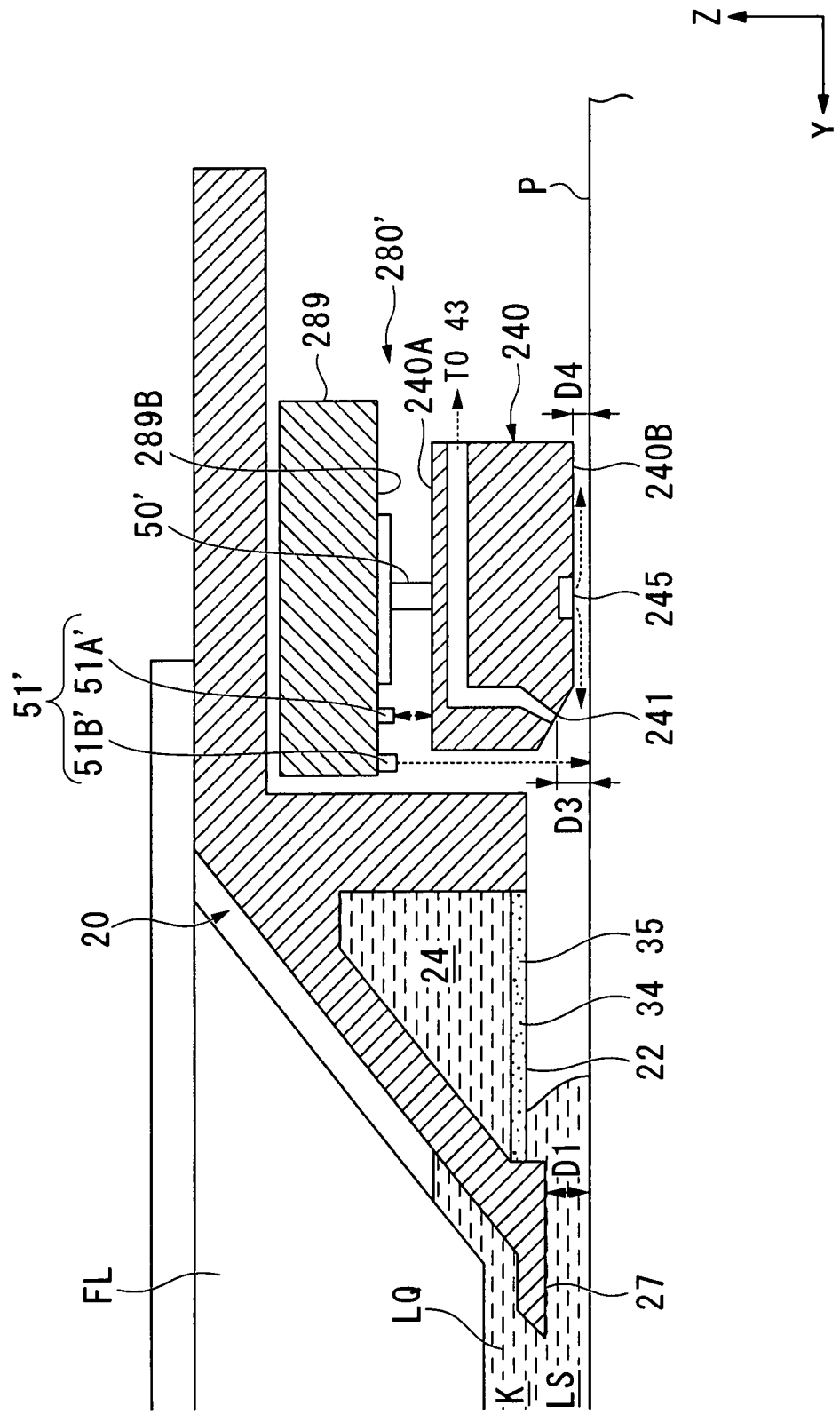
FIG. 18 is a drawing that shows the vicinity of a trap member relating to the seventh embodiment.

FIG. 18 is an enlarged drawing that shows a portion of the exposure apparatus EX relating to the seventh embodiment. In FIG. 18, a support mechanism 280' comprises a drive apparatus 50', which moves a liquid recovery member 240, and a detection apparatus 51', which detects the positional relationship between the liquid recovery member 240 and the substrate P. In the present embodiment as well, the support mechanism 280' is mechanically separated from the nozzle member 20, which is held by a holding mechanism 70, and supports the liquid recovery member 240.

The drive apparatus 50' includes, for example, a voice coil motor or a linear motor, etc. that performs driving by Lorentz force, and it is able to drive the liquid recovery member 240 in at least the Z axis, $\theta X$ and $\theta Y$ directions.

The drive apparatus 50' is provided so as to connect a support surface 289B of a support structure body 289 and the upper surface 240A of the liquid recovery member 240. The control apparatus 3 is able to move the liquid recovery member 240 in at least the Z axis, $\theta X$ and $\theta Y$ directions with respect to the support surface 289B of the support structure body 289 by driving the drive apparatus 50'.

The detection apparatus 51' comprises a first detection apparatus 51A', which detects the positional relationship between the support surface 289B of the support structure body 289 and the liquid recovery member 240, and a second detection apparatus 51B', which detects the positional relationship between the support surface 289B of the support structure body 289 and the substrate P that is held by the substrate stage 2. The first detection apparatus 51A' includes a laser interferometer, etc. provided on the support surface 289B for example, and it uses the reflecting surface provided on the upper surface 240A of the liquid recovery member 240 to optically detect the position of the liquid recovery member 240 with respect to the support surface 289B. The second detection apparatus 51B' also optically detects the position of the substrate P with respect to the support surface 289B.

The first detection apparatus 51A' irradiates detection light to the respective reflecting surfaces respectively provided at a plurality of prescribed positions of the upper surface 240A of the liquid recovery member 240 and is able to detect the position of the liquid recovery member 240 in relation to the Z axis, $\theta X$ and $\theta Y$ directions. The positional relationship between the upper surface (reflecting surface) 240A of the liquid recovery member 240 and the lower surface 240B of the liquid recovery member 240 is already known through the design values, etc., so the first detection apparatus 51A' is able to use the reflecting surface of the upper surface 240A of the liquid recovery member 240 to detect the position of the lower surface 240B of the liquid recovery member 240 in relation to the Z axis, $\theta X$ and $\theta Y$ directions. In addition, the second detection apparatus 51B' irradiates detection light to the respective prescribed positions of the plurality of the surface of the substrate P and is able to detect the position of the surface of the substrate P, which is held by the substrate stage 2, in relation to the Z axis, $\theta X$ and $\theta Y$ directions. The detection results of the detection apparatus 51', which includes the first and second detection apparatuses 51A', 51B', are output to the control apparatus 3. The control apparatus 3, based on the detection results of the detection apparatus 51', is able to obtain the positional relationship between the lower surface 240B of the liquid recovery member 240 and the surface of the substrate P in relation to the Z axis, $\theta X$ and $\theta Y$ directions, specifically, the distance D4 between the lower surface 240B of the liquid recovery member 240 and the surface of the substrate P. Note that the detection apparatus 51' is not limited to a laser interferometer, and it is also possible to use a detection apparatus that has a configuration, such as an electrostatic capacitance sensor, an encoder, etc.

In the present embodiment as well, in a status in which at least a liquid immersion space LS is formed, the distance D3 between the second liquid recovery port 241 and the surface of the substrate P is set to be smaller than the distance D1 between the nozzle member 20 and the substrate P.

The control apparatus 3 maintains a status in which the distance D3 between the second liquid recovery port 241 and the substrate P is smaller than the distance D1 between the nozzle member 20 and the substrate P based on the detection results of the drive apparatus 51' while controlling the drive apparatus 50' so that the liquid recovery member 240 and the substrate P do not come into contact. Even in the case in which the position and attitude (tilt) of the substrate P change, such as during substrate P scanning exposure, the control apparatus 3 drives the drive apparatus 50' based on the detection results of the detection apparatus 51' so that the distance D4 between the surface of the substrate P and the lower surface 240A of the liquid recovery member 240 is maintained to be nearly fixed. Through this, it is possible to restrict the substrate P from coming into contact with the liquid recovery member 240 while recovering the thin film-shaped and/or drop-shaped liquid LQ that is present on the substrate P using the second liquid recovery port 241, which is provided on the liquid recovery member 240, without complete recovery by means of the first liquid recovery port 22, and it is possible to prevent the liquid LQ from remaining on the substrate P. Note that the second liquid recovery port 241 may be such that one is continuously arranged so as to surround the nozzle member 20, or it may be such that a plurality is arranged in a dispersed manner so as to surround the nozzle member 20.

In addition, in the present embodiment as well, a gas blow out port 245, which blows out gas toward the substrate P, is provided on the lower 240B of the liquid recovery member 240. And a layer (film) of gas that has high pressure is formed between the lower surface 240B of the liquid recovery member 240 and the surface of the substrate P by means of the gas that is blown out from the gas blow out port 245. For this reason, it is possible to restrict outflow of the liquid LQ by means of that layer of gas that has high pressure.

In addition, after a portion of the gas that has been blown out from the gas blow out port 45 has been blown to the substrate P, a gas flow toward the optical path space K is produced so as to follow the surface of the substrate P. Due to a gas flow toward the optical path space K being produce, through the force of that gas, it is possible to bring the liquid LQ on the substrate P nearer to the second liquid recovery port 241, and it is possible to more reliably also cover the liquid LQ on the substrate P that has leaked to the outer side of the first liquid recovery port 22.

In addition, the control apparatus 3 is able to drive the drive apparatus 50' to cause the liquid recovery member 240 to withdraw upward. For example, the control apparatus 3 is able to drive the drive apparatus 50' to adjust the position of the liquid recovery member 240 so that the distance D4 between the lower surface 240B of the liquid recovery member 240 and the surface of the substrate P becomes larger than the distance D1 between the land surface 27 of the nozzle member 20 and the surface of the substrate P.

Note that, in the present embodiment, it is not absolutely necessary that a gas bearing be formed between the liquid recovery member 240 and the surface of the substrate P. The control apparatus 3, by driving the drive apparatus 50' based on the detection results of the detection apparatus 51', is able to maintain a minute distance D4 so that the liquid recovery member 240 and the substrate P do not come into contact and bring the second liquid recovery port 241 nearer to the surface of the substrate P. In addition, in the present embodiment, the gas blow out port 245 may also be omitted.

Note that, in the present embodiment, the drive apparatus 50' is used to move the liquid recovery member 240 so that the distance D4 between the surface of the substrate P and the lower surface 240B of the liquid recovery member 240 becomes nearly fixed, specifically, so that changes in the position and attitude of the substrate P are followed. However, for example, when the distance D4 between the surface of the substrate P and the lower surface 240B of the liquid recovery member 240 has become a prescribed value or less due to changes in the position or attitude of the substrate P, the drive apparatus 50' may be used to move the liquid recovery member 240 so that the liquid recovery member 240 and the substrate P do not come into contact.

In addition, in the present embodiment, the second liquid recovery port 241 may be provided at the lower surface 240B of the liquid recovery member 240. The distance D4 between the liquid recovery member 240 (240B) and the surface of the substrate P becomes the distance D3 between the second liquid recovery port 241 and the surface of the substrate P, and it is possible to quickly recover the film-shaped and/or drop-shaped liquid LQ on the substrate P from the second liquid recovery port 241.

In addition, in the present embodiment as well, in the same way as the embodiments discussed above, it is possible to provide trap members (60, 160) in the vicinity of the second liquid recovery port 241.

In addition, in the present embodiment as well, in the same way as the sixth embodiment discussed above, it is possible to provide a gas blow out port, which blows out gas toward the surface of the substrate P, on a separate member from the liquid recovery member 240 that is provided with the second liquid recovery port 241.

Eighth Embodiment

Next, an eighth embodiment will be explained. In the present embodiment, a modified example of the nozzle member 20 will be explained. In the explanation below, identical codes are assigned to major constituent portions that are the same as or similar to those of the embodiments discussed above, and explanations thereof will be abbreviated or omitted. In addition, in the eighth embodiment, configurations other than that of the nozzle member are similar to those of the first embodiment, but it is, of course, possible to apply the nozzle member of the eighth embodiment to the second to seventh embodiments.

Figure 19:
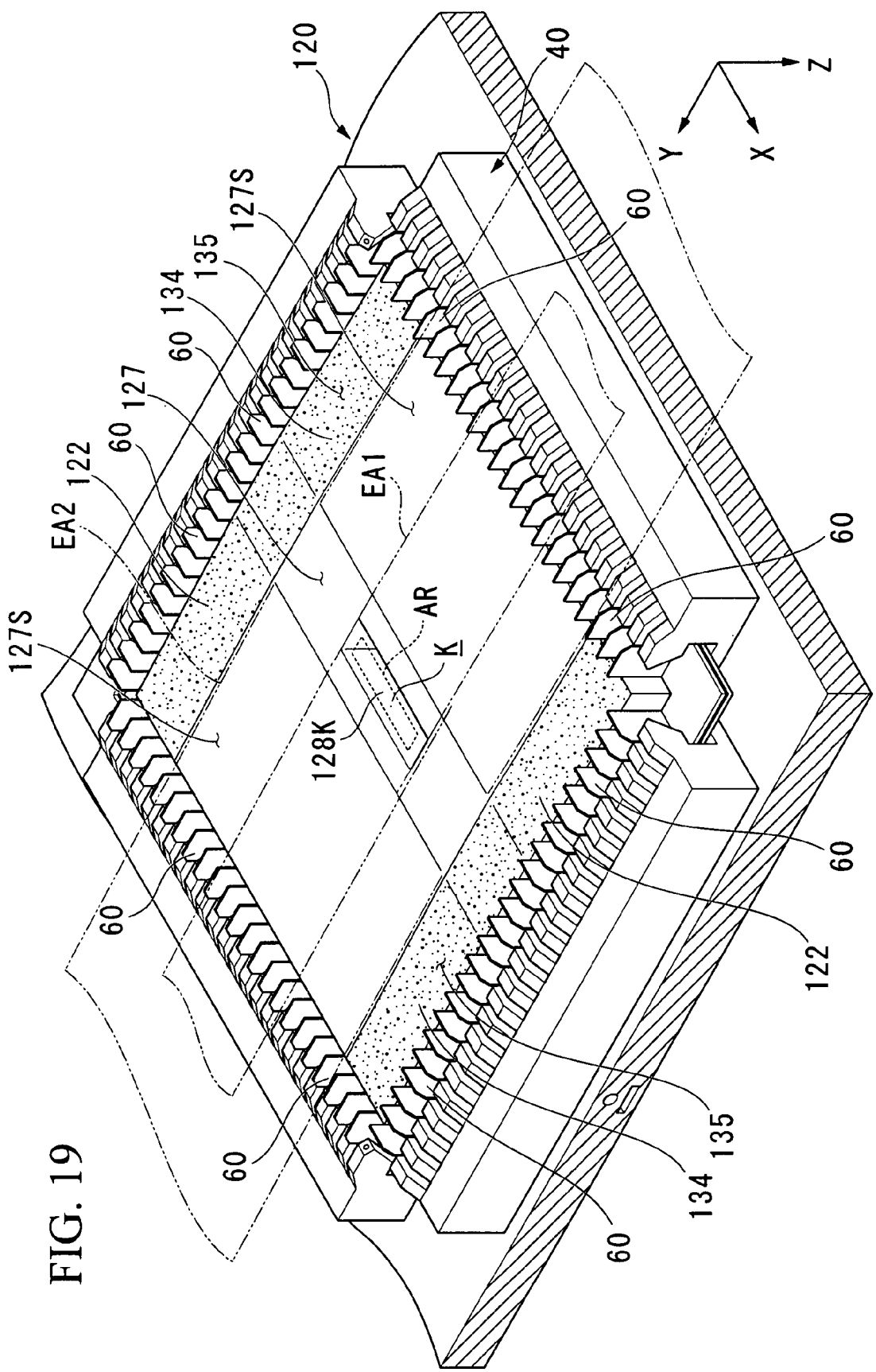
FIG. 19 is a perspective view of the vicinity of the nozzle member relating to the eighth embodiment as seen from the lower side.
Figure 20:
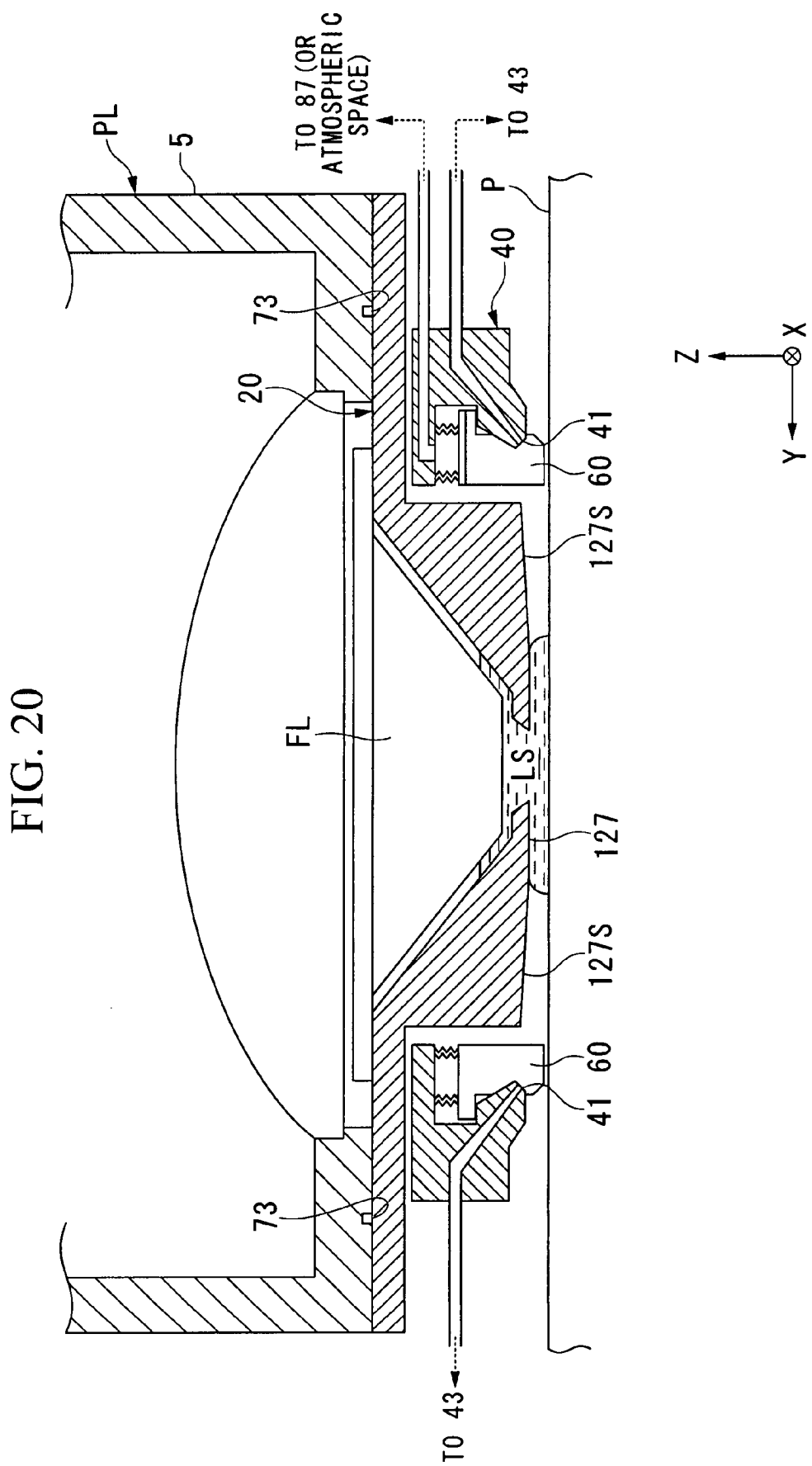
FIG. 20 is a side cross sectional view that is parallel to the YZ plane and shows the vicinity of the nozzle member relating to the eighth embodiment.

FIG. 19 is an oblique view of the vicinity of the nozzle member 120, trap members 60, and the liquid recovery member 40 relating to the eighth embodiment as seen from the bottom side, and FIG. 20 is a side cross view list is parallel to the YZ plane.

As shown in FIG. 19 and FIG. 20, on the nozzle member 120, the first liquid recovery ports 122 are arranged at the outer sides of a first extension area EA1, which extends in the Y axis direction (scanning direction) with respect to the optical path space K of the exposure light EL. In the present embodiment, the first liquid recovery ports 122 are arranged at both sides of the first extension area EA1 in relation to the Y axis direction. The size of the first extension area EA1 in the X axis direction is nearly equivalent to the size of the cross sectional shape of the optical path space K of the exposure light EL in the X axis direction (the size of the projection area AR in the X axis direction).

In the same way as in the embodiments discussed above, the nozzle member 120 has a land surface 127 that is provided so as to oppose the surface of the substrate P and so as to surround the optical path space K of the exposure light EL and is able to hold the liquid LQ between itself and the surface of the substrate P. The land surface 127 has lyophilicity with respect to the liquid LQ. The land surface 127 is nearly parallel to the surface (XY plane) of the substrate P held by the substrate stage 2. In the present embodiment, the external shape of the land surface 127 is an approximately rectangular shape that has the X axis direction as the lengthwise direction. The size of the land surface 127 in the X axis direction is larger than the size of the optical path space K of the exposure light EL in the X axis direction. In addition, the first liquid recovery ports 122 are arranged at the outer sides of a second extension area EA2 that extends in the Y axis direction (scanning direction) with respect to the land surface 127.

The second extension area EA2 includes the first extension area EA1, and the size of the second extension area EA2 in the X axis direction is larger than the size of the first extension area EA1 in the X axis direction. In the present embodiment, the first liquid recovery ports 122 are arranged at both sides of the second extension area EA1, which includes the first extension area EA1, in relation to the Y axis direction.

In addition, the nozzle member 120 has a slanted surface 127S, which is provided respectively at both sides of the Y axis direction with respect to the land surface 127 so as to oppose the surface of the substrate P. The slanted surface 127S also has lyophilicity with respect to the liquid LQ (for example, the contact angle of the liquid LQ is 40° or less) in the same way as the land surface 127. The slanted surface 127S is able to hold the liquid LQ between itself and the surface of the substrate P. The slanted surface 127S is provided at a position that is more separated with respect to the surface of the substrate P than the land surface 127. Specifically, the slanted surface 127S is tilted so that the distance with respect to the substrate P becomes larger as the outer side is approached from the optical path space K of the exposure light EL in relation to the Y axis direction. In addition, there is almost no level difference between the land surface 127 and the slanted surface 127S. The size of the slanted surface 127S in the X axis direction is nearly equal to the size of the land surface 127 in the X axis direction. Specifically, the second extension area EA2 includes the slanted surface 127S.

Specifically, the first liquid recovery ports 122 are respectively provided to be approximately mutually parallel at both sides of the X axis direction with respect to the optical path space K of the exposure light EL so as to extend in the Y axis direction.

In addition, in the same way as the embodiments discussed above, porous members 134 are arranged at the first liquid recovery ports 122. The lower surfaces 135 of the porous members 134 arranged at both sides of the land surface 127 are nearly parallel to the surface (XY plane) of the substrate P, which is held by the substrate stage 2, and the lower surfaces 135 of the porous members 134 arranged at both sides of the slanted surface 127S are tilted so that the distance with respect to the substrate P becomes larger as the outer side is approached from the optical path space K of the exposure light EL in relation to the Y axis direction. In the present embodiment, the lower surfaces 135 of the porous members 134 arranged at both sides of the land surface 127 are nearly flush with the land surface 127. The lower surfaces 135 of the porous members 134 arranged at both sides of the slanted surface 127S are also nearly flush with the slanted surface 127S.

In the present embodiment, the external shape of the land surface 127 is small, and it is possible to make the liquid immersion space LS small within a range in which the optical path space K of the exposure light EL is adequately filled with the liquid LQ. Through this, it is possible to restrict the liquid LQ from leaking out, and it is possible to pursue a more compact exposure apparatus EX. In addition, even in the case in which the substrate P has moved in the Y axis direction in a status in which a liquid immersion space LS has been formed, the liquid LQ is restricted from becoming a thin film or becoming drops on the substrate P.

In addition, the first liquid recovery ports 122 are arranged at the outer sides of the extension areas EA1, EA2, which extend in the Y axis direction with respect to the optical path space K of the exposure light EL. So, for example, even in the case in which substrate P has moved in a direction that is diagonal to the Y axis direction within the XY plane or has moved in the X axis direction, it is possible to recover the liquid LQ well by means of the first liquid recovery ports 122, and it is possible to restrict the liquid LQ from leaking out or remaining. In addition, even in the case in which the substrate P has been moved in the Y axis direction in a status in which a liquid immersion space LS has been formed, the first liquid recovery ports 122 are arranged at the outer sides of the extension areas EA1, EA2, which extend in the Y axis direction with respect to the optical path space K of the exposure light EL, so, for example, it is possible to restrict the liquid LQ from being excessively recovered and form the liquid immersion space LS well while performing exposure.

In addition, in the present embodiment, there is nearly no level difference at the liquid contact surface of the nozzle member 120, which is able to come into contact with the liquid LQ (including the land surface 127, the slanted surface 127S and the lower surfaces 135 of the porous members 134), so it is possible to restrict gas bubbles from mixing into the liquid LQ or to restrict the liquid LQ from leaking out.

Note that, in the first to eighth embodiments discussed above, a plurality of trap members (60, 160) is arranged in a rectangular frame shape, but it is not limited to a rectangular shape, and a plurality of trap members may be arranged in, for example, an octagonal frame shape, and a plurality of trap members may be arranged in a circular frame shape. In the case in which a plurality of plate-shaped trap members are arranged in a circular frame shape, all of the plate-shaped trap members can be arranged radially with respect to the optical path space K of the exposure light EL (optical axis AX of the final optical element FL).

In addition, the trap members (60, 160) are not limited to a plate shape, and they may also be another shape. For example, the trap members may also be rod-shaped or thread-shaped members.

In addition, in the first to eighth embodiments discussed above, the trap members (60, 160) and/or the second liquid recovery ports (41, 141, 241) are arranged so as to surround the nozzle member 20, but it is not limited to this, and the trap members and/or the second liquid recovery ports may also be arranged only in a direction (at a position) at which the liquid LQ tends to become thin film and/or drops on the substrate P, for example, at both sides of the optical path space K in relation to the Y axis direction. In addition, as discussed above, in the respective embodiments noted above, the case in which a liquid immersion space LS is formed in a status in which the substrate P opposes the nozzle member (20, 120) was explained, but even in the case in which the nozzle member opposes another object (for example, the upper surface of the substrate stage 2), it is possible to prevent the liquid LQ from remaining on that object, and it is possible to prevent contamination, etc. of that object.

Note that the liquid LQ of the embodiments discussed above is water, but it may also be a liquid other than water, for example, in the case in which the light source of the exposure light EL is an $F_2$ laser, this $F_2$ laser light does not pass through water, so the liquid LQ may be a fluorine group fluid such as perfluoropolyether (PFPE) or fluorine oil that is able to transmit $F_2$ laser light. In addition, it is also possible to use a liquid LQ that has transmittivity with respect to the exposure light EL, has as high a refractive index as possible, and is stable with respect to the photoresist that is coated onto the projection optical system PL and the surface of the substrate P (for example, cedar oil). In addition, a liquid LQ with a refractive index of approximately 1.6 to 1.8 may be used. In addition, the optical elements LS1 may also be formed of a material that has a higher refractive index (for example, 1.6 or higher) than that of quartz or fluorite.

As liquid LQ with a refractive index higher than that of pure water (for example greater than 1.5), specific liquids with C—H bonds or O—H bonds such as isopropanol with refractive index of about 1.50, glycerol (glycerine) with refractive index of about 1.61, specific liquids (organic solvents) such as hexane, heptane, decane, or Decalin (Decahydronaphthalene) with refractive index of about 1.60 may be used. The liquid LQ may also be a combination of two or more kinds of any of the liquids mentioned above, or it may be any one of these liquids added (mixed) with pure water. Furthermore, the liquid LQ may be pure water with base or acid such as $H^+$, $Cs^+$, $K^+$, $Cl^-$, $SO_4^{2-}$, $PO_4^{2-}$ added (mixed) to it, or may be pure water with fine particles of Al oxide added (mixed) to it. The liquid used should preferably have a small light absorption coefficient, less temperature dependency, and stability of photosensitive material (or top coat film or reflection preventing film, and so on) coated on the surface of the projection optical system and/or the substrate. A supercritical fluid may also be used as the liquid. A top coat film and the like to protect the photosensitive material and base material from the liquid may be provided on the substrate. The front optical element may be formed of single crystals of silica or fluorine compounds such as calcium fluoride (fluorite), barium fluoride, strontium fluoride, lithium fluoride, and sodium fluoride, or it may be formed of a material with higher refractive index (greater than 1.6, for example) than silica or fluorite. Sapphire, germanium dioxide, and so on disclosed in PCT International Publication WO 2005/059617, or potassium chloride (refractive index of about 1.75) disclosed in PCT International Publication No. WO 2005/059618, may be used material with refractive index greater than 1.6.

The above embodiments, are ones which measure the position information of the mask stage and the substrate stage using an interferometer system. However the invention is not limited to this, and for example an encoder system that detects a scale (grating) provided for example on the top surface of the substrate stage may be used. In this case, as a hybrid system which use both the interferometer system and the encoder system, preferably the measurement results of the interferometer system are used to perform calibration on the detection results of the encoder system. Furthermore, the interferometer system and the encoder system may be alternately used, or both may be used, to perform position control of the substrate stage.

Note that the projection optical system of the embodiments discussed above is such that the optical path space K of the image plane side of the final optical element FL is filled with the liquid LQ, but it is also possible to employ a projection optical system in which the optical path space of the object plane side of the final optical element FL is also filled with the liquid as disclosed in PCT International Publication No. WO 2004/019128.

In addition, in the embodiments discussed above, the configuration of the nozzle member is not limited to those discussed above, and it is possible to use one disclosed in, for example, PCT International Publication No. WO 2004/086468 or PCT International Publication No. WO 2005/024517.

Note that applicable as the substrate P of the aforementioned respective embodiments are not only a semiconductor wafer for the manufacture of semiconductor devices but glass substrates for display devices, ceramic wafers for thin film magnetic heads, mask or reticle base plates, etc. (synthetic quartz, silicon wafer) used in exposure apparatuses, or a film member. The substrate is not limited to circular shape; rectangular or other shapes may be used.

Applicable as the exposure apparatus EX are, in addition to step and scan system scanning exposure apparatuses (scanning steppers) that synchronously move the mask M and the substrate P to scan expose the pattern of a mask M, step and repeat system projection exposure apparatuses (steppers) that full-field expose the pattern on the mask M in a status in which the mask M and the substrate P have been made stationary and sequentially step move the substrate P.

In addition, application to an exposure apparatus of a system that full-field exposes a reduced image of a first pattern onto a substrate P using as the exposure apparatus EX a projection optical system (for example, a refracting projection optical system that does not include a reflecting element and whose reduction ratio is 1/8) in a status in which both the first pattern and the substrate P have been made nearly stationary is also possible. In this case, it is also applicable to a stitch system full field exposure apparatus that subsequently full-field exposes a reduced image of the second pattern onto a substrate P so that it is partially superposed with the first pattern using that projection optical system in a status in which the second pattern and the substrate P have been made nearly stationary. In addition, for the stitch system exposure apparatus, application to a step and stitch system exposure apparatus that partially superposes at least two patterns on the substrate P and sequentially moves the substrate P is also possible.

In addition, the present invention is also applicable to a multi-stage type exposure apparatus comprising a plurality of substrate stages, such as those disclosed in Japanese Unexamined Patent Application Publication No. H10-163099, Japanese Unexamined Patent Application Publication No. H10-214783 and Published Japanese Translation No. 2000-505958 of PCT International Publication.

Furthermore, the exposure apparatus EX according to each of the embodiments mentioned above, may be moved independently from the substrate stage holding the substrate, and may be provided with a measurement stage equipped with measurement members (for example, reference member formed with reference marks and/or various kinds of photoelectric sensor), as disclosed, for example, in the Japanese Unexamined Patent Application, First Publication No. H11-135400 (corresponding to PCT International Patent Publication No. WO 1999/23692) and the Japanese Unexamined Patent Application, First Publication No. 2000-164504 (corresponding to U.S. Pat. No. 6,897,963). In addition, it is also applicable to an exposure apparatus that comprises a plurality of substrate stages and measuring stages. The exposure apparatus provided with this measurement stage may have the measurement stage wherein a plurality of measurement members including aerial image measurement instrument mentioned above are all installed, but with at least one of the plurality of measurement members installed in the substrate stage.

In other embodiments, electronic mask that generates variable patterns (also called variable pattern forming mask, active mask or pattern generator) may be used. For example, a deformable micro-mirror device or digital micro-mirror device (DMD), which is a kind of non-radiative type display element (also called spatial light modulator (SLM) may be used as the electronic mask. The DMD has a plurality of reflecting elements (micro-mirrors) that are driven based on specified electronic data. The angle of the reflective surface of each reflective element is adjusted. DMD operation can be controlled by a control device. The control device drives the DMD reflective elements based on electronic data (pattern information) according to the pattern to be formed on the substrate; the reflective elements form a shape from the exposure light emitted by the illumination system. The control drives the reflecting elements of each DMD and forms patterns of the exposure light shone by the illumination system using the reflecting elements, based on the electronic data (pattern information) corresponding to the first and second patterns to be formed on the substrate. By using DMD, mask alignment operations in the mask stage and during the mask replacement work are not required when the pattern is changed, therefore, the multiple exposure is performed with more efficiently, in contrast to the case when exposure is performed using mask (reticle) on which pattern is formed. A mask stage is not installed in an exposure apparatus using electronic mask; the substrate may merely be moved in the X-axis and the Y-axis directions by the substrate stage. Moreover, to adjust the relative position of the images of the first and second patterns on the substrate, the relative position of the electronic mask that generates the patterns may be adjusted by an actuator and the like. The exposure apparatus using DMD is disclosed, for example, in Japanese Unexamined Patent Application, Publication No. H08-313842, Japanese Unexamined Patent Application, Publication No. 2004-304135, and U.S. Pat. No. 6,778,257.

The types of exposure apparatuses EX are not limited to exposure apparatuses for semiconductor device fabrication that expose a semiconductor device pattern on a substrate P but are also widely applicable to exposure apparatuses for the manufacture of liquid crystal display elements and for the manufacture of displays, and exposure apparatuses for the manufacture of thin film magnetic heads, image pickup elements (CCDs), micro-machines, MEMS, DNA chips, or reticles or masks.

Note that, in the embodiments discussed above, a light transmitting type mask in which a prescribed light shielding pattern (or phase pattern/light reduction pattern) has been formed on a light transmissive substrate is used, but, instead of this mask, an electronic mask that forms a transmission pattern or refection pattern or a light emission pattern based on electronic data of the pattern to be exposed may be used as disclosed, for example, in U.S. Pat. No. 6,778,257.

In addition, it is also possible to apply the present invention to an exposure apparatus (lithography system) that exposes a line and space pattern onto a substrate P by forming interference fringes on the substrate P as disclosed in PCT International Publication No. WO 2001/035168.

As far as is permitted, the disclosures in all of the Japanese Patent Publications and U.S. patents related to exposure apparatuses and the like cited in the above respective embodiments and modified examples, are incorporated herein by reference.

As discussed above, the exposure apparatuses EX of the embodiments discussed above are manufactured by assembling various subsystems, including the respective constituent elements, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly of the various subsystems to the exposure apparatus has ended, overall adjustment is performed, and the various precisions are ensured for the exposure apparatus as a whole. Note that it is preferable that the manufacture of the exposure apparatus be performed in a clean room in which the temperature, the degree of cleanliness, etc. are controlled.

Figure 21:
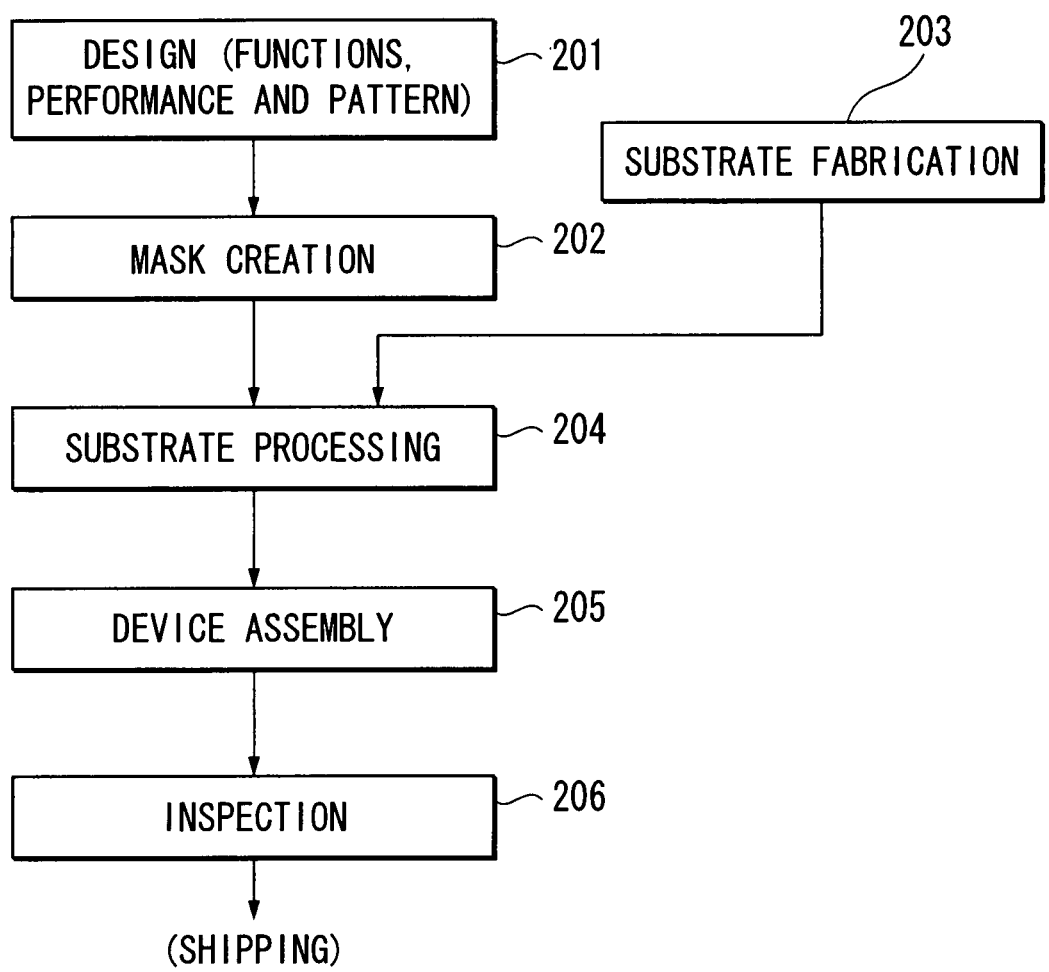
FIG. 21 is a flow chart that shows an example of the device manufacturing process.

As shown in FIG. 21, microdevices such as semiconductor devices are manufactured by going through a step 201 that performs microdevice function and performance design, a step 202 that creates the mask (reticle) based on this design step, a step 203 that manufactures the substrate that is the device base material, a substrate processing step 204 that includes an exposure process, which exposes the pattern on the mask onto a substrate by means of an exposure apparatus EX of the embodiments discussed above, and a developing process, which develops the substrate after exposure, a device assembly step (including treatment processes such as the dicing process, bonding process and packaging process) 205, an inspection step 206, etc.

According to the present invention, it is possible to restrict leaking out of liquid and perform exposure processing and measuring processing well.

What is claimed is:

1. An exposure apparatus that irradiates exposure light onto a substrate to expose the substrate, comprising:
   a first member, which is arranged so as to oppose a surface of the substrate, and between which and a surface of the substrate a liquid immersion space is formed;
   a second member, which traps liquid that is present at the surface of the substrate, a distance between the second member and the substrate being smaller than a distance between the first member and the substrate; and
   a support apparatus configured to support the second member so that the second member is mechanically separated from the first member, wherein
   the first member has a first liquid recovery port arranged so as to oppose the surface of the substrate,
   the second member is positioned at an outer side of the first liquid recovery port with respect to an optical path space of the exposure light, and
   the second member is configured to trap the liquid that is present on the substrate without there being complete recovery by the first liquid recovery port.

2. An exposure apparatus according to claim 1, further comprising:
   a second liquid recovery port, which is arranged in the vicinity of the second member and recovers the liquid that has been trapped by the second member.

3. An exposure apparatus according to claim 2, wherein the second member is arranged so as to guide a flow of fluid toward the second liquid recovery port.

4. An exposure apparatus according to claim 3, wherein the second member is arranged so as to increase a flow rate of the fluid that flows toward the second liquid recovery port.

5. An exposure apparatus according to claim 1, wherein
the first member has a flat part, which is provided so as to oppose the surface of the substrate and so as to surround the optical path space of the exposure light and between which and the surface of the substrate the liquid is held,
the first liquid recovery port is arranged at the outer side of the flat part with respect to the optical path space of the exposure light, and
the distance between the second member and the substrate is smaller than a distance between the flat part and the substrate.

6. An exposure apparatus according to claim 1, wherein
scanning exposure of the substrate is performed while moving the substrate in a prescribed direction, and
the first liquid recovery port is arranged at the outer side of an extension area that extends in the prescribed direction with respect to the optical path space of the exposure light.

7. An exposure apparatus according to claim 6, wherein the first liquid recovery port is arranged at both sides of the extension area in relation to the prescribed direction.

8. An exposure apparatus according to claim 1, wherein the second member is arranged so as to surround an optical path space of the exposure light.

9. An exposure apparatus according to claim 1, wherein the second member includes a flexible member.

10. An exposure apparatus according to claim 1, wherein the second member includes a plurality of plate-shaped members.

11. An exposure apparatus according to claim 10, wherein at least a portion of the plurality of plate-shaped members is arranged radially with respect to an optical path space of the exposure light.

12. An exposure apparatus according to claim 1, further comprising:
an optical member, which is arranged so as to oppose the substrate and emits the exposure light, and wherein
the second member includes a plurality of members arranged along a direction that intersects a plane including an optical axis of the optical member.

13. An exposure apparatus according to claim 1,
wherein the support apparatus that movably supports the second member with respect to the surface of the substrate.

14. An exposure apparatus according to claim 13, wherein the support apparatus includes an elastic body.

15. An exposure apparatus according to claim 14, wherein
the elastic body has an internal space, and
the support apparatus adjusts the distance between the second member and the substrate by adjusting a pressure of gas of the internal space.

16. An exposure apparatus according to claim 13, wherein the support apparatus includes a drive apparatus that drives the second member.

17. An exposure apparatus according to claim 16, further comprising:
a detection apparatus that detects the distance between the second member and the surface of the substrate; and
a control apparatus that controls the drive apparatus based on a detection result of the detection apparatus so that the second member and the substrate do not come into contact.

18. An exposure apparatus according to claim 13, further comprising:
a gas blow out port that is provided at the outer side of the second member with respect to an optical path space of the exposure light and blows out gas toward the surface of the substrate.

19. An exposure apparatus according to claim 18, wherein
the support apparatus has a support member, which has a lower surface opposing the surface of the substrate and supports the second member, and
the gas blow out port is provided at a lower surface of the support member.

20. An exposure apparatus according to claim 19, wherein a gas bearing is formed between the surface of the substrate and the lower surface of the support member by blowing out gas from the gas blow out port.

21. A method for manufacturing a device by irradiating exposure light onto the substrate with the exposure apparatus according to claim 1.

22. An exposure apparatus that irradiates exposure light onto a substrate to expose the substrate, comprising:
a first member, which is arranged so as to oppose a surface of the substrate, and between which and a surface of the substrate a liquid immersion space is formed;
a second member, which traps liquid that is present at the surface of the substrate, a distance between the second member and the substrate being smaller than a distance between the first member and the substrate; and
a support apparatus configured to support the second member so that the second member is mechanically separated from the first member, wherein
the support apparatus movably supports the second member with respect to the surface of the substrate,
the first member has a first liquid recovery sort arranged so as to oppose the surface of the substrate, and
the second member is configured to trap the liquid that is present on the substrate without there being complete recover by the first liquid recovery port.

23. An exposure apparatus according to claim 22, wherein
the second member is positioned at an outer side of the first liquid recovery port with respect to an optical path space of the exposure light.

24. An exposure apparatus according to claim 23, further comprising:
a second liquid recovery port, which is arranged in the vicinity of the second member and recovers the liquid that has been trapped by the second member.

25. An exposure apparatus according to claim 24, wherein the second member is arranged so as to guide a flow of fluid toward the second liquid recovery port.

26. An exposure apparatus according to claim 25, wherein the second member is arranged so as to increase a flow rate of the fluid that flows toward the second liquid recovery port.

27. An exposure apparatus according to claim 23, wherein
the first member has a flat part, which is provided so as to oppose the surface of the substrate and so as to surround the optical path space of the exposure light and between which and the surface of the substrate the liquid is held,
the first liquid recovery port is arranged at the outer side of the flat part with respect to the optical path space of the exposure light, and
the distance between the second member and the substrate is smaller than a distance between the flat part and the substrate.

28. An exposure apparatus according to claim 23, wherein
scanning exposure of the substrate is performed while moving the substrate in a prescribed direction, and the first liquid recovery port is arranged at the outer side of an extension area that extends in the prescribed direction with respect to the optical path space of the exposure light.

29. An exposure apparatus according to claim 28, wherein the first liquid recovery port is arranged at both sides of the extension area in relation to the prescribed direction.

30. An exposure apparatus to according claim 22, wherein the second member is arranged so as to surround an optical path space of the exposure light.

31. An exposure apparatus according to claim 22, wherein the second member includes a flexible member.

32. An exposure apparatus according to claim 22, wherein the second member includes a plurality of plate-shaped members.

33. An exposure apparatus according to claim 32, wherein at least a portion of the plurality of plate-shaped members is arranged radially with respect to an optical path space of the exposure light.

34. An exposure apparatus according to claim 22, further comprising:
   an optical member, which is arranged so as to oppose the substrate and emits the exposure light, and wherein
   the second member includes a plurality of members arranged along a direction that intersects a plane including an optical axis of the optical member.

35. An exposure apparatus according to claim 22, wherein the support apparatus includes an elastic body.

36. An exposure apparatus according to claim 35, wherein the elastic body has an internal space, and
   the support apparatus adjusts the distance between the second member and the substrate by adjusting a pressure of gas of the internal space.

37. An exposure apparatus according to claim 22, wherein the support apparatus includes a drive apparatus that drives the second member.

38. An exposure apparatus according to claim 37, further comprising:
   a detection apparatus that detects the distance between the second member and the surface of the substrate; and
   a control apparatus that controls the drive apparatus based on a detection result of the detection apparatus so that the second member and the substrate do not come into contact.

39. An exposure apparatus according to claim 22, further comprising:
   a gas blow out port that is provided at the outer side of the second member with respect to an optical path space of the exposure light and blows out gas toward the surface of the substrate.

40. An exposure apparatus according to claim 39, wherein the support apparatus has a support member, which has a lower surface opposing the surface of the substrate and supports the second member, and
   the gas blow out port is provided at a lower surface of the support member.

41. An exposure apparatus according to claim 40, wherein a gas bearing is formed between the surface of the substrate and the lower surface of the support member by blowing out gas from the gas blow out port.

42. A method for manufacturing a device by irradiating exposure light onto the substrate with the exposure apparatus according to claim 22.

* * * * *